(12) United States Patent
Kanzawa et al.

(10) Patent No.: US 8,619,460 B2
(45) Date of Patent: Dec. 31, 2013

(54) NONVOLATILE MEMORY DEVICE AND METHOD FOR PROGRAMMING NONVOLATILE MEMORY ELEMENT

(75) Inventors: Yoshihiko Kanzawa, Osaka (JP); Takeshi Takagi, Kyoto (JP)

(73) Assignee: Panasonic Corporation, Osaka (JP)

( * ) Notice: Subject to any disclaimer, the term of this patent is extended or adjusted under 35 U.S.C. 154(b) by 28 days.

(21) Appl. No.: 13/509,616

(22) PCT Filed: Oct. 26, 2011

(86) PCT No.: PCT/JP2011/005974
§ 371 (c)(1),
(2), (4) Date: May 14, 2012

(87) PCT Pub. No.: WO2012/056689
PCT Pub. Date: May 3, 2012

(65) Prior Publication Data
US 2013/0010522 A1    Jan. 10, 2013

(30) Foreign Application Priority Data

Oct. 29, 2010   (JP) .................................. 2010-244407

(51) Int. Cl.
*G11C 11/00* (2006.01)
(52) U.S. Cl.
USPC .............................. 365/148; 365/158; 365/51
(58) Field of Classification Search
USPC ..................................... 365/148, 158, 51, 171
See application file for complete search history.

(56) References Cited

U.S. PATENT DOCUMENTS 7,894,239 B2 * 2/2011 Tamai et al. .................. 365/148

| | | | |
|---|---|---|---|
| 2004/0114444 A1 | 6/2004 | Matsuoka | |
| 2005/0275064 A1 | 12/2005 | Li et al. | |
| 2006/0097288 A1 | 5/2006 | Baek et al. | |

(Continued)

FOREIGN PATENT DOCUMENTS

| JP | 2004-234707 | 8/2004 |
|---|---|---|
| JP | 2005-050424 | 2/2005 |

(Continued)

OTHER PUBLICATIONS

International Search Report issued Dec. 20, 2011 in International (PCT) Application No. PCT/JP2011/005974.

*Primary Examiner* — David Lam
(74) *Attorney, Agent, or Firm* — Wenderoth, Lind & Ponack, L.L.P.

(57) ABSTRACT

A nonvolatile memory device (800) includes a variable resistance nonvolatile memory element (100) and a control circuit (810). The control circuit (810) determines whether a resistance value of the nonvolatile memory element (100) in a high resistance state is equal to or greater than a predetermined threshold value. Moreover, if the resistance value of the nonvolatile memory element (100) in the high resistance state is smaller than the threshold value, the control circuit (810) applies a first voltage (VL1) to the nonvolatile memory element (100) to change a resistance state of the nonvolatile memory element (100) from the high resistance state to the low resistance state. Moreover, if the resistance value of the nonvolatile memory element (100) in the high resistance state is equal to or greater than the threshold value, the control circuit (810) applies to the nonvolatile memory element (100) a second voltage (VL2) an absolute value of which is smaller an absolute value of the first voltage (VL1) to change the resistance state of the nonvolatile memory element (100) from the high resistance state to the low resistance state.

19 Claims, 21 Drawing Sheets

(56) References Cited

U.S. PATENT DOCUMENTS

| | | |
|---|---|---|
| 2006/0104106 A1 | 5/2006 | Aratani et al. |
| 2007/0221975 A1 | 9/2007 | Li et al. |
| 2008/0089112 A1 | 4/2008 | Aratani et al. |
| 2009/0224224 A1 | 9/2009 | Fujii et al. |
| 2009/0283736 A1 | 11/2009 | Kanzawa et al. |
| 2010/0202185 A1 | 8/2010 | Katoh et al. |
| 2011/0110143 A1 | 5/2011 | Kanzawa et al. |
| 2011/0294259 A1 | 12/2011 | Kanzawa et al. |

FOREIGN PATENT DOCUMENTS

| | | |
|---|---|---|
| JP | 2005-340806 | 12/2005 |
| JP | 2006-140412 | 6/2006 |
| JP | 2006-140464 | 6/2006 |
| WO | 2008/059701 | 5/2008 |
| WO | 2008/149484 | 12/2008 |
| WO | 2009/034687 | 3/2009 |
| WO | 2010/116754 | 10/2010 |

* cited by examiner

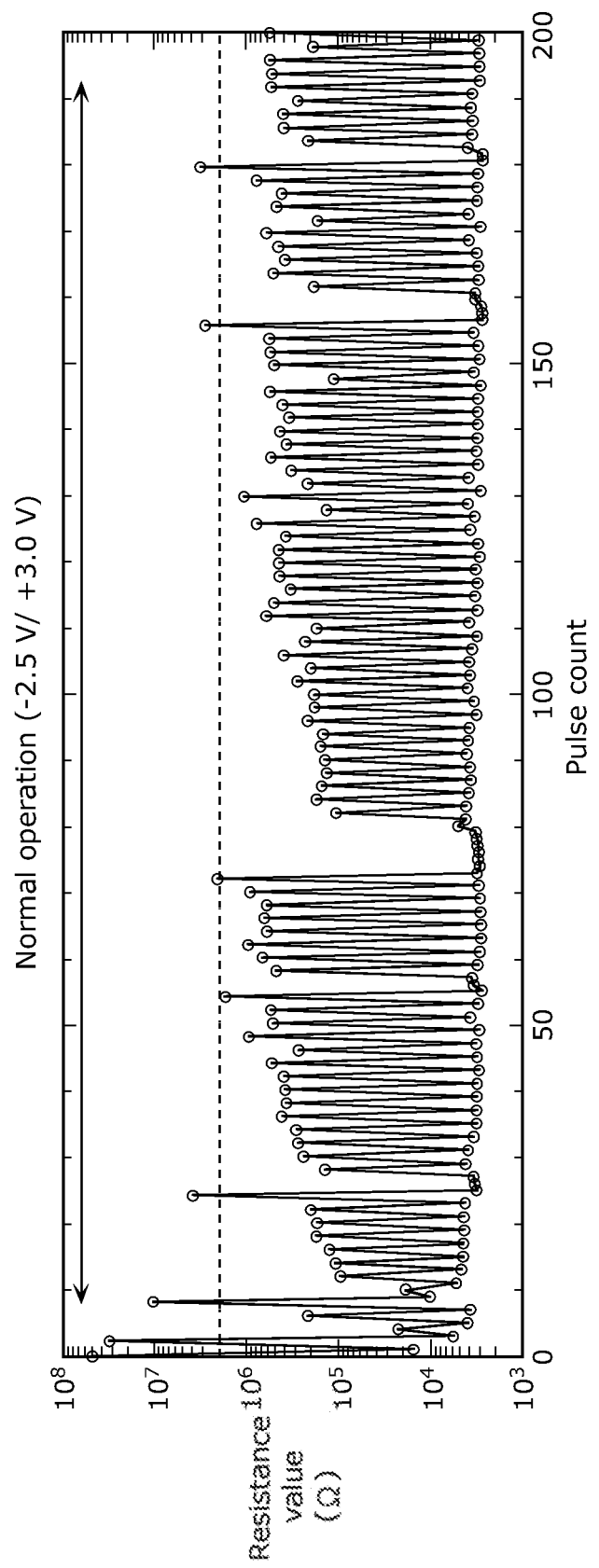

NONVOLATILE MEMORY DEVICE AND METHOD FOR PROGRAMMING NONVOLATILE MEMORY ELEMENT

TECHNICAL FIELD

The present invention relates to a nonvolatile memory device which includes a variable resistance nonvolatile memory element a resistance value of which changes depending on an electrical signal applied thereto, and a method for programming the nonvolatile memory element.

BACKGROUND ART

In recent years, with advance in digital technology, electronic devices such as mobile information devices and information consumer electronics have been developed to provide higher functionality. Therefore, there is increasing demands for nonvolatile memory elements incorporated in these devices to have a large capacity, reduced write power, high speed for write time and read time, and a long lifetime.

In response to such demands, miniaturization of existing flash memory using a floating gate is said to be limited. Thus, recently, there is increasing attention on novel variable resistance nonvolatile memory elements using a variable resistance layer as a memory unit.

The variable resistance nonvolatile memory element has a fairly simple structure in which the variable resistance layer is sandwiched between a bottom electrode and a top electrode. By only giving between the top and bottom electrodes a predetermined electrical pulse having a voltage equal to or greater than a certain threshold value, a resistance state of the variable resistance nonvolatile memory element changes between a high resistance state and a low resistance state. Then, information is recorded by associating these different resistance states and values with each other. Due to the simplicity in structure and operation, further miniaturization and cost reduction of the variable resistance nonvolatile memory element are expected. Furthermore, the resistance state of the variable resistance nonvolatile memory element may change between the high resistance and the low resistance on the order of 100 nanoseconds (ns) or less, and thus the variable resistance nonvolatile memory element draws attention from the stand point of high-speed operation, and there are various proposals.

Recently, there are proposals regarding variable resistance nonvolatile memory elements using materials, in particular, a metal oxide as the variable resistance layer. The variable resistance nonvolatile memory elements using such metal oxides are broadly categorized in two types, based on a material used as the variable resistance layer.

One type is a variable resistance nonvolatile memory element, disclosed in PTL 1 or the like, that uses a perovskite material (such as $Pr_{(1-x)}Ca_xMnO_3$ (PCMO), $LaSrMnO_3$ (LSMO), and $GdBaCo_xO_y$ (GBCO)) as a variable resistance layer.

The other type is a variable resistance nonvolatile memory element that uses a binary transition metal oxide which is a composition comprising solely a transition metal and oxygen. The binary transition metal oxide has a fairly simple compositional structure as compared to the above-described perovskite material. Thus, compositional control and deposition upon manufacturing are relatively easy. In addition, the binary transition metal oxide has an advantage that the binary transition metal oxide has relatively good conformity with semiconductor manufacturing processes, and thus, recently, extensive studies are made thereon.

For example, PTL 2 discloses a variable resistance element which uses, as a material of the variable resistance layer, an oxide having a stoichiometric composition or an oxide having a shortage of oxygen in the stoichiometric composition (hereinafter, referred to as an oxygen-deficient oxide), which comprises a transition metal, such as nickel (Ni), niobium (Nb), titanium (Ti), zirconium (Zr), hafnium (Hf), cobalt (Co), iron (Fe), copper (Cu), chromium (Cr).

Furthermore, PTL 3 discloses a nonvolatile memory element using an oxygen-deficient tantalum (Ta) oxide as a variable resistance material, and reports a resistance change phenomenon in a range satisfying $0.8 \leq x \leq 1.9$ (from 44.4% to 65.5% in terms of oxygen concentration) when Ta-oxide layer is represented by $TaO_x$.

Furthermore, PTL 4 proposes a variable resistance nonvolatile memory element having a stacked structure comprising Ta oxides having different oxygen concentrations.

Moreover, operationally, two different operation modes referred to as a unipolar (monopolar) switching and a bipolar switching are reported in the variable resistance nonvolatile memory element.

First, the unipolar switching is an operation mode in which electrical pulses having a same polarity of different magnitudes are applied between the bottom electrode and the top electrode to change a resistance value, which is disclosed in PTL 2 and the like. Moreover, as disclosed in PTL 4, in the unipolar switching, it is required to change the lengths of electrical pulses (pulse widths). For example, it is required to use two types of electrical pulses that have a length on the order of ns and a length on the order of microsecond (µs).

Meanwhile, the bipolar switching is an operation mode in which electrical pulses having different polarities which are positive and negative are applied between the bottom electrode and the top electrode to change the resistance value, which is disclosed in PTLs 1 and 3. As disclosed in PTL 3, electrical pulses for use in bipolar switching nonvolatile memory element are in general set to have a same length, and mostly on the order of ns. That is, a nonvolatile memory element allowing the bipolar switching has a feature that widths of the negative and positive pulses can be set to be fairly short and have a same length.

As described above, various types of variable resistance nonvolatile memory elements are proposed up to present. However, these variable resistance nonvolatile memory elements have a feature in common in which a predetermined voltage is applied to change the resistance state between the high resistance state and the low resistance state, and information is recorded by associating these resistance states and values with each other. Typically, it is defined that a state in which the nonvolatile memory element has a resistance value equal to or greater than a certain threshold value is the high resistance state, and a state in which the nonvolatile memory element has the resistance value less than the threshold value is the low resistance state. Moreover, typically, for example, data "1" and data "0" are assigned to the high resistance state and the low resistance state, respectively, in recording the information.

However, even if an attempt is made to apply a predetermined voltage to the element in the low resistance state to set the element to be in the high resistance state, the resistance value may not exceed the threshold value, ending up being a somewhat decreased resistance value. In contrast, even if an attempt is made to apply a predetermined voltage to the element in the high resistance state to change the resistance state to the low resistance state, the resistance value may not fall being equal to or less than the threshold value, ending up being a half-reduced value. In such cases, the element in the high resistance state may inadvertently be determined to be in the low resistance state, or the element in the low resistance state may inadvertently be determined to be in the high resistance state. That is, not setting a desired value to the resistance value leads directly to error in setting a memorized data.

To prevent such an error, for example, PTL 5 proposes a confirmation operation to verify whether the resistance value in the set resistance state satisfies for the threshold value. According to this method, for example, if it is desired to set the resistance value satisfying the high resistance state, a voltage which changes the resistance state to the high resistance state is applied to the element, and then the resistance value is read to determine whether the resistance value exceeds the threshold value. If the resistance value exceeds the threshold value, the setting for the resistance value ends. In contrast, if the resistance value does not exceed the threshold value, the voltage is re-applied to the element to re-set the resistance value. The resistance value is then re-read to determine whether the resistance value exceeds the threshold value. By repeating such operations, the resistance state of the element is set to be a desired state.

CITATION LIST

Patent Literature

[PTL 1] Japanese Unexamined Patent Application Publication No. 2005-340806
[PTL 2] Japanese Unexamined Patent Application Publication No. 2006-140464
[PTL 3] WO2008/059701
[PTL 4] WO2008/149484
[PTL 5] Japanese Unexamined Patent Application Publication No. 2004-234707

SUMMARY OF INVENTION

Technical Problem

Through intensive studies to improve the reliability of the variable resistance nonvolatile memory element, the inventors found characteristics failures (a held low resistance state or a held high resistance state) which cannot be handled by the conventional programming method as shown in PTL 5.

The present invention is made in view of the above problems and an object of the present invention is to provide a nonvolatile memory device able to inhibit the held low resistance state or the held high resistance state in a variable resistance nonvolatile memory element, and a method for programming the nonvolatile memory element.

Solution to Problem

To solve the above-described problems, a nonvolatile memory device according to one embodiment of the present invention includes a nonvolatile memory element including: a first electrode; a second electrode; and a variable resistance layer a resistance state of which reversibly changes between a high resistance state and a low resistance state in which a resistance value of the variable resistance layer is smaller than the resistance value in the high resistance state, based on electrical signals having different polarities which are given between the first electrode and the second electrode, the variable resistance layer being interposed between the first electrode and the second electrode; and a control circuit for applying a voltage having a first polarity between the first electrode and the second electrode to change a resistance state of the variable resistance layer from the low resistance state to the high resistance state, and applying a voltage having a second polarity opposite to the first polarity between the first electrode and the second electrode to change the resistance state of the variable resistance layer from the high resistance state to the low resistance state, wherein the control circuit: determines whether the resistance value of the variable resistance layer in the high resistance state is equal to or greater than a first threshold value; applies a first voltage having the second polarity between the first electrode and the second electrode if the resistance value of the variable resistance layer in the high resistance state is smaller than the first threshold value, to change the resistance state of the variable resistance layer from the high resistance state to the low resistance state; and applies a second voltage, which has the second polarity and an absolute value of which is smaller than an absolute value of the first voltage, between the first electrode and the second electrode if the resistance value of the variable resistance layer in the high resistance state is equal to or greater than the first threshold value, to change the resistance state of the variable resistance layer from the high resistance state to the low resistance state.

According to the above structure, the nonvolatile memory device according to one embodiment of the present invention can inhibit the held low resistance state.

Moreover, the nonvolatile memory device may further include an electrical element which has a resistance component and is connected in series with the nonvolatile memory element; a first power source for low resistance writing for generating a first low resistance writing voltage which has the second polarity; and a second power source for low resistance writing for generating a second low resistance writing voltage which has the second polarity and an absolute value of which is smaller than an absolute value of the first low resistance writing voltage, wherein the control circuit may: apply the first low resistance writing voltage across a series circuit which includes the nonvolatile memory element and the electrical element if the resistance value of the variable resistance layer in the high resistance state is smaller than the first threshold value, to apply the first voltage between the first electrode and the second electrode; and apply the second low resistance writing voltage across the series circuit if the resistance value of the variable resistance layer in the high resistance state is equal to or greater than the first threshold value, to apply the second voltage between the first electrode and the second electrode.

Moreover, the nonvolatile memory device may further include a variable resistance element connected in series with the nonvolatile memory element; and a power source for low resistance writing for generating the low resistance writing voltage which has the second polarity, wherein the control circuit may: set a first resistance value to the variable resistance element and apply the low resistance writing voltage across a series circuit which includes the nonvolatile memory element and the variable resistance element if the resistance value of the variable resistance layer in the high resistance state is smaller than the first threshold value, to apply the first voltage between the first electrode and the second electrode; and set a second resistance value greater than the first resistance value to the variable resistance element and apply the low resistance writing voltage across the series circuit if the resistance value of the variable resistance layer in the high resistance state is equal to or greater than the first threshold value, to apply the second voltage between the first electrode and the second electrode.

Moreover, the variable resistance element may include a first resistance element and a second resistance element, wherein the first resistance element, the second resistance element, and the nonvolatile memory element are connected in series in the stated order, and the control circuit may: apply the low resistance writing voltage across a first series circuit which includes the second resistance element and the nonvolatile memory element if the resistance value of the variable resistance layer in the high resistance state is smaller than the first threshold value, to apply the first voltage between the first electrode and the second electrode; and apply the low resistance writing voltage across a second series circuit which includes the first resistance element, the second resistance element, and the nonvolatile memory element if the resistance value of the variable resistance layer in the high resistance state is equal to or greater than the first threshold value, to apply the second voltage between the first electrode and the second electrode.

Moreover, the variable resistance element may include a first resistance element and a second resistance element which are connected in parallel to each other, a resistance value of the second resistance element may be greater than a resistance value of the first resistance element, and the control circuit may: apply the low resistance writing voltage across a first series circuit which includes the nonvolatile memory element and the first resistance element if the resistance value of the variable resistance layer in the high resistance state is smaller than the first threshold value, to apply the first voltage between the first electrode and the second electrode; and apply the low resistance writing voltage across a second series circuit which includes the nonvolatile memory element and the second resistance element if the resistance value of the variable resistance layer in the high resistance state is equal to or greater than the first threshold value, to apply the second voltage between the first electrode and the second electrode.

Moreover, the variable resistance element may include a transistor, and the control circuit may change an ON resistance of the transistor by changing a voltage applied to a gate of the transistor, to change a resistance value of the variable resistance element.

Moreover, to change the resistance state of the variable resistance layer from the high resistance state to the low resistance state, the control circuit may: determine whether the resistance value of the variable resistance layer in the high resistance state is equal to or greater than the first threshold value; apply the first voltage between the first electrode and the second electrode if the resistance value of the variable resistance layer in the high resistance state is smaller than the first threshold value, to change the resistance state of the variable resistance layer from the high resistance state to the low resistance state; and apply the second voltage, the absolute value of which is smaller than the absolute value of the first voltage, between the first electrode and the second electrode if the resistance value of the variable resistance layer in the high resistance state is equal to or greater than the first threshold value, to change the resistance state of the variable resistance layer from the high resistance state to the low resistance state.

Moreover, to change the resistance state of the variable resistance layer from the low resistance state to the high resistance state, the control circuit may repeat, until the resistance value of the variable resistance layer in the high resistance state is smaller than the first threshold value: changing the resistance state of the variable resistance layer from the low resistance state to the high resistance state; determining whether the resistance value of the variable resistance layer in the high resistance state is equal to or greater than the first threshold value; and applying the second voltage, the absolute value of which is smaller than the absolute value of the first voltage, between the first electrode and the second electrode if the resistance value of the variable resistance layer in the high resistance state is equal to or greater than the first threshold value, to change the resistance state of the variable resistance layer from the high resistance state to the low resistance state.

Moreover, the variable resistance layer may include at least two oxide layers comprising a transition metal and having different oxygen concentrations, and among the at least two oxide layers, an oxide layer that has a highest oxygen concentration may be in contact with the first electrode or the second electrode.

Moreover, the transition metals may be tantalum.

Moreover, if the resistance value of the variable resistance layer in the high resistance state is equal to or greater than the first threshold value and the resistance state of the nonvolatile memory element is changed from the high resistance state to the low resistance state, the nonvolatile memory element may cause a held low resistance state to occur.

Moreover, the control circuit may further: determine whether the resistance value of the variable resistance layer in the high resistance state is equal to or greater than a second threshold value greater than the first threshold value; and apply a third voltage, an absolute value of which is smaller than the absolute value of the second voltage and which has the second polarity, between the first electrode and the second electrode if the resistance value of the variable resistance layer in the high resistance state is equal to or greater than the second threshold value, to change the resistance state of the variable resistance layer from the high resistance state to the low resistance state.

According to the above structure, the nonvolatile memory device according to one embodiment of the present invention can prevent the held low resistance state and reduce variation in resistance value of the nonvolatile memory element, by controlling, in multiple steps, a voltage value of the low resistance writing voltage, in accordance with the resistance value.

Moreover, the nonvolatile memory device according to one embodiment of the present invention may include a nonvolatile memory element including: a first electrode; a second electrode; and a variable resistance layer a resistance state of which reversibly changes between a high resistance state and a low resistance state in which a resistance value of the variable resistance layer is smaller than the resistance value in the high resistance state, based on electrical signals having different polarities which are given between the first electrode and the second electrode, the variable resistance layer being interposed between the first electrode and the second electrode; and a control circuit for applying a voltage having a first polarity between the first electrode and the second electrode to change a resistance state of the variable resistance layer from the low resistance state to the high resistance state, and applying a voltage having a second polarity opposite to the first polarity between the first electrode and the second electrode to change the resistance state of the variable resistance layer from the high resistance state to the low resistance state, wherein the control circuit may: determine whether the resistance value of the variable resistance layer in one state between the high resistance state and the low resistance state is equal to or greater than a predetermined threshold value; change the resistance state of the variable resistance layer from the one state between the high resistance state and the low resistance state to the other state on a first write condition if the resistance value of the variable resistance layer is smaller than the threshold value; and change the resistance state of the variable resistance layer from the one state to the other state on a second write condition weaker than the first write condition if the resistance value of the variable resistance layer is equal to or greater than the threshold value.

According to the above structure, the nonvolatile memory device according to one embodiment of the present invention can prevent the held low resistance state or the held high resistance state.

Moreover, the control circuit may: change the resistance state of the variable resistance layer from the one state to the other state on the first write condition, in which a first voltage is applied between the first electrode and the second electrode, if the resistance value of the variable resistance layer is smaller than the threshold value; and change the resistance state of the variable resistance layer from the one state to the other state on the second write condition, in which a second voltage an absolute value of which is smaller than an absolute value of the first voltage is applied between the first electrode and the second electrode, if the resistance value of the variable resistance layer is equal to or greater than the threshold value.

Moreover, the control circuit may: change the resistance state of the variable resistance layer from the one state to the other state on the first write condition in which the first voltage is applied between the first electrode and the second electrode for a first time if the resistance value of the variable resistance layer is smaller than the threshold value; and change the resistance state of the variable resistance layer from the one state to the other state by applying a second voltage between the first electrode and the second electrode for a second time shorter than the first time if the resistance value of the variable resistance layer is equal to or greater than the threshold value.

Moreover, the one state may be the high resistance state, and the other state may be the low resistance state.

According to the above structure, the nonvolatile memory device according to one embodiment of the present invention can inhibit the held low resistance state.

Moreover, the one state may be the low resistance state, and the other state may be the high resistance state.

According to the above structure, the nonvolatile memory device according to one embodiment of the present invention can inhibit the held high resistance state.

It should be noted that the present invention can not only be implemented as such a nonvolatile memory device but also as a method for programming a nonvolatile memory element having characteristic units, as steps, included in the nonvolatile memory device, or as a program for causing a computer to execute such characteristic steps. In addition, such a program can, of course, be distributed by being stored in a storage medium such as CD-ROM and via a transmission medium such as the Internet.

Furthermore, the present invention can be implemented as a semiconductor integrated circuit (LSI) which achieves a part or the whole functionality of such the nonvolatile memory device.

Advantageous Effects of Invention

From the foregoing, the present invention can provide a nonvolatile memory device which can inhibit a held low resistance state and a held high resistance state, and a method for programming a nonvolatile memory element.

BRIEF DESCRIPTION OF DRAWINGS

FIG. 3A is a diagram showing relationship between a resistance value of the nonvolatile memory element according to the first embodiment of the present invention and the number of times the voltage pulse is applied.

DESCRIPTION OF EMBODIMENTS

The present invention is based on new findings by the inventors. Hereinafter, the findings will be first described and thereafter embodiments of the present invention will be described. It should be noted that, hereinafter, the findings by the inventors will be described with reference to FIG. 23. However, this is intended as an aid in understanding the embodiments described below. Thus, the present invention is not limited to the drawings and the below description.

Through intensive studies to improve the reliability of variable resistance nonvolatile memory elements, the inventors found serious error in setting that cannot be corrected by conventional methods.

A nonvolatile memory element comprising an oxygen-deficient tantalum (Ta) oxide as a variable resistance material is fabricated by the inventors, operated by having an electrical pulse applied thereto, and examined how the resistance value changes. It should be noted that the element is a variable resistance nonvolatile memory element exhibiting bipolar switching characteristics, the resistance state of which changes to a high resistance state when a positive voltage based on a bottom electrode is applied to a top electrode, and changes to a low resistance state when a negative voltage based on the bottom electrode is applied to the top electrode.

Figure 23:
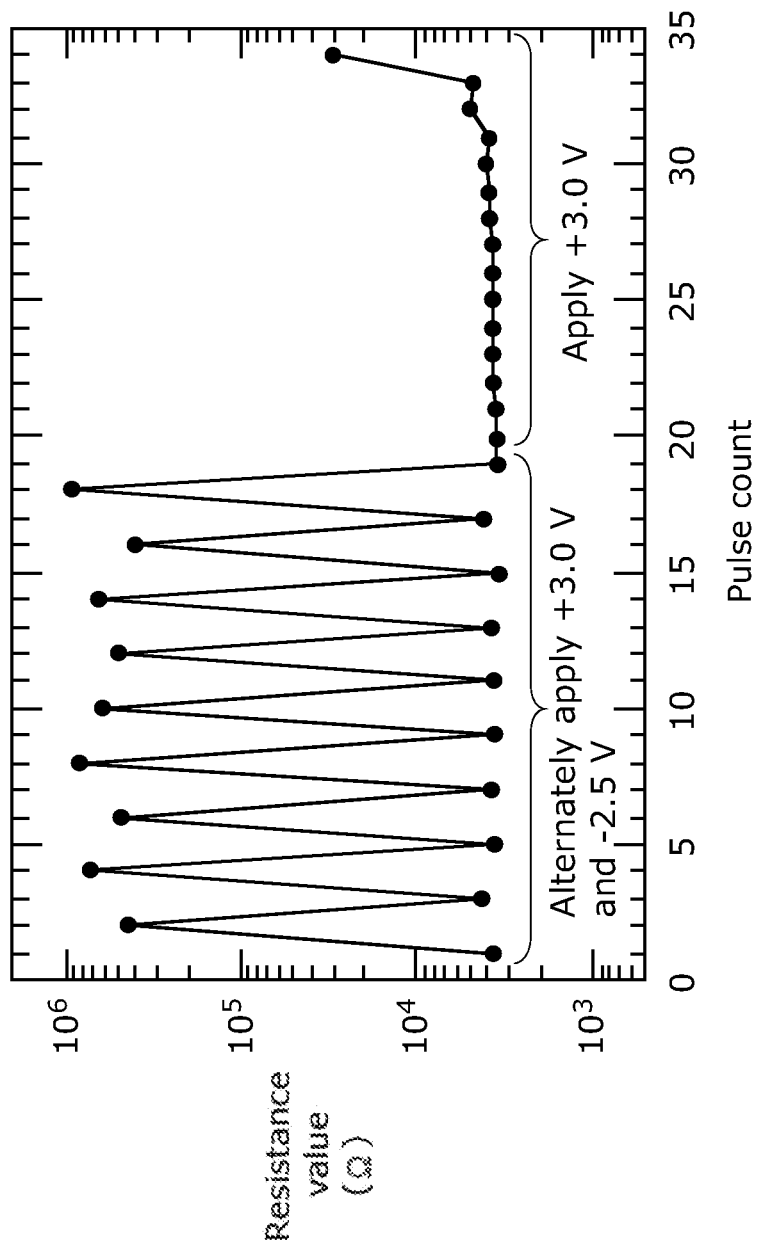
FIG. 23 is a diagram showing relationship between a resistance value of a nonvolatile memory element and the number of times a pulse is applied.

The measurement result is shown in FIG. 23. Upon obtaining the data, the nonvolatile memory element is operated by alternately applying an electrical pulse of +3.0 V and 100 ns and an electrical pulse of −2.5 V and 100 ns to the top electrode in a state in which a resistive load element of 5 kΩ is connected to the prepared nonvolatile memory element. FIG. 23 shows how the resistance value changes at this time.

In the figure, up to 18th pulse, the element is in the high resistance state where the resistance value is $4 \times 10^5 \Omega$ to $1 \times 10^6 \Omega$, by having applied thereto the electrical pulse of +3.0 V and 100 ns. Meanwhile, when the electrical pulse of −2.5 V and 100 ns is applied to the element, the element is in the low resistance state where the resistance value is $3 \times 10^3 \Omega$ to $4 \times 10^3 \Omega$. As such, the resistance change occurs well.

After the electrical pulse of −2.5 V is applied to the element at 19th and the resistance state of the element changes to the low resistance state, the electrical pulse of +3.0 V is applied at 20th. However, the resistance value remains essentially unchanged. Namely, an error in setting the resistance value is present. Thus, after 21st, the electrical pulse of +3.0 V is applied in succession. However, the resistance state of the element remains unchanged to the high resistance state, and, finally, changes to the high resistance state by application of 34th pulse (application of the electrical pulse of +3.0 V 15 times in row). Moreover, while not shown, the error occurs in some elements such that the resistance state of the element does not change to the high resistance state no matter how many times the electrical pulse of +3.0 V is applied. In this case, the resistance states of some elements change to the high resistance state by having applied thereto the electrical pulses equal to or greater than +3.0 V and the resistance states of some elements do not change to the high resistance state while having applied thereto the electrical pulse of +4.0 V.

It should be noted that, hereinafter, a state in which the resistance state of an element does not change to the high resistance state even if an electrical pulse for changing the resistance state to the high resistance state is applied to the element in the low resistance state as described above is expressed in the literature as "held low resistance state." In contrast, a state in which the resistance state of an element does not change to the low resistance state even if an electrical pulse for changing the resistance state to the low resistance state is applied to the element in the high resistance state is expressed in the literature as "held high resistance state."

As described above, once the held low resistance state or the held high resistance state phenomena occurs, it is necessary to apply additional electrical pulses several number of times to return to a state in which the resistance change can be caused, which is undesirable because it leads to reduction in operation speed. In the worst case scenario, the subsequent operation may end up being disabled. This, of course, means reduction in reliability of the element.

Considering these problems, the inventors of the present invention conceived a nonvolatile memory device which can inhibit the held low resistance state or the held high resistance state in a variable resistance nonvolatile memory element and a method for programming the nonvolatile memory element.

Hereinafter, embodiments of the present invention will be described with accompanying drawings. It should be noted that the embodiments described below are each merely a preferred illustration of the present invention. Values, shapes, materials, components, disposition or a form of connection between the components, steps, and the order of the steps are merely illustrative, and are not intended to limit the present invention. The present invention is limited only by the scope of the appended claims. Thus, among components of the below embodiments, components not set forth in the independent claims indicating the top level concept of the present invention are not necessary to achieve the present invention but will be described as components for preferable embodiments.

First Embodiment

In the present embodiment, a result will be shown which is obtained from researching a method for preventing a held low resistance state which is one phenomena of resistance change error in a variable resistance nonvolatile memory element comprising an oxygen-deficient tantalum (Ta) oxide as a variable resistance layer.

[Element Structure]

Figure 1:
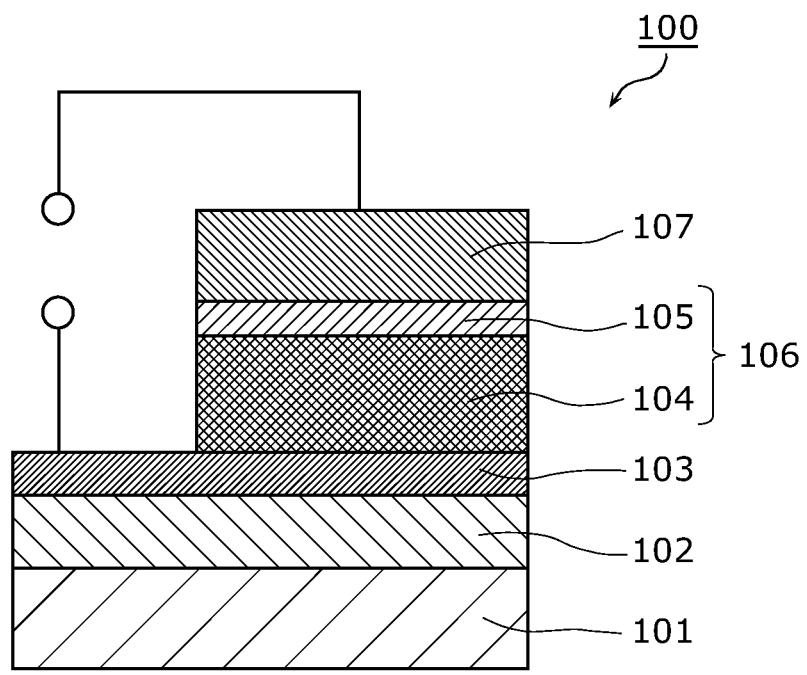
FIG. 1 is a cross-sectional view showing a structure of a nonvolatile memory element according to a first embodiment of the present invention.

FIG. 1 is a cross-sectional view showing an example of a structure of a nonvolatile memory element 100 according to a first embodiment of the present invention.

As shown in FIG. 1, the nonvolatile memory element 100 according to the present embodiment includes a substrate 101, an oxide layer 102 formed above the substrate 101, and a bottom electrode 103, a variable resistance layer 106, and a top electrode 107 that are formed above the oxide layer 102.

The variable resistance layer 106 is interposed between the top electrode 107 and the bottom electrode 103, and, based on electrical signal amplitudes applied between the top electrode 107 and the bottom electrode 103, a resistance state of the variable resistance layer reversibly changes between a high resistance state and a low resistance state in which a resistance value is lower than that in the high resistance state. The electrical signal amplitudes have different polarities and are equal to or greater than threshold values. It should be noted that if the variable resistance layer 106 included in the nonvolatile memory element 100 is in the high resistance state, it will be denoted, hereinafter, that the resistance state of the nonvolatile memory element 100 is the high resistance state. Likewise, if the variable resistance layer 106 included in the nonvolatile memory element 100 is in the low resistance state, it will be denoted that the resistance state of the nonvolatile memory element 100 is the low resistance state.

Moreover, as a material of the variable resistance layer 106, for example, an oxygen-deficient transition metal oxide (preferably, an oxygen-deficient Ta-oxide) is used. The oxygen-deficient transition metal oxide is an oxide having a small oxygen content (atomic ratio: a ratio of the number of oxygen atoms relative to the total number of atoms) as compared to an oxide having a stoichiometric composition. Typically, the oxide having the stoichiometric composition has an insulator or a very high resistance value. For example, if the transition metal is Ta, a stoichiometric composition of the oxide is represented by $Ta_2O_5$, and the atomic ratio (O/Ta) of Ta and O is 2.5. Thus, the atomic ratio of Ta and O in the oxygen-deficient Ta-oxide is greater than 0 and smaller than 2.5. In the present embodiment, preferably, the oxygen-deficient transition metal oxide is the oxygen-deficient Ta-oxide. More preferably, the variable resistance layer at least has a stacked structure in which a first tantalum-containing layer having a composition represented by $TaO_x$ (wherein, $0<x<2.5$) and a second tantalum-containing layer having a composition represented by $TaO_y$ (wherein, $x<y$) are stacked. Additional layers, for example, a third tantalum-containing layer or a layer comprising other transition metal oxide may, of course, be disposed accordingly. Here, to achieve a stable operation as a variable resistance element, preferably, $TaO_x$ satisfies $0.8 \leq x \leq 1.9$ and $TaO_y$ satisfies $2.1 \leq y$. Preferably, a thickness of the second tantalum-containing layer is equal to or greater than 1 nm and equal to or less than 8 nm.

Hereinafter, an example will be described in which the variable resistance layer 106 includes a first oxygen-deficient Ta-oxide layer 104, and a second oxygen-deficient Ta-oxide layer 105 having a higher oxygen concentration than the first oxygen-deficient Ta-oxide layer 104.

To program the nonvolatile memory element 100, a voltage satisfying predetermined conditions is applied between the bottom electrode 103 and the top electrode 107 by an external power source.

Moreover, the bottom electrode 103 and the top electrode 107 correspond to a first electrode and a second electrode, respectively, of the present invention.

[Method for Manufacturing Nonvolatile Memory Element]

Next, a method for manufacturing the nonvolatile memory element 100 according to the present embodiment will be described.

First, on the substrate 101, the oxide layer 102 having a thickness of 200 nm is formed by a thermal oxidation method. Then, a tantalum nitride (TaN) having a thickness of 40 nm is formed as the bottom electrode 103 on the oxide layer 102 by a reactive sputtering method in which a Ta target is used and sputtered in a gas mixture comprising argon (Ar) and nitrogen ($N_2$).

Next, on the bottom electrode 103, the first oxygen-deficient Ta-oxide layer 104 is deposited so as to have a thickness of 50 nm. Here, the first oxygen-deficient Ta-oxide is formed by a reactive sputtering method in which a Ta target is sputtered in a gas comprising Ar and oxygen ($O_2$) gases. It should be noted that specific conditions upon depositing the oxygen-deficient Ta-oxide are that the degree of vacuum (back pressure) inside a sputtering apparatus prior to the start of sputtering is about $7 \times 10^{-4}$ Pa, power when sputtering is 250 W, a total gas pressure in combination of argon gas and oxygen gas is 3.3 Pa, a ratio of partial pressure of the oxygen gas is 3.8%, a temperature set to the substrate is 30° C., and deposition time is seven minutes. Due to this, the first oxygen-deficient Ta-oxide layer 104 having a thickness of 50 nm and the oxygen content percentage of about 58 atm % is deposited. It should be noted that when the oxygen-deficient Ta-oxide is represented by $TaO_x$, the oxygen content percentage 58 atm % is 1.38 in terms of x.

Next, a surface of the first oxygen-deficient Ta-oxide layer 104 is oxidized by a plasma oxidization apparatus to form the second oxygen-deficient Ta-oxide layer 105 (it should be noted that the layer is provided for a purpose of stabilizing the initial operation of the element and is not necessarily provided for forming the elements) having a thickness of about 6 nm. It should be noted that the oxygen content percentage of the second oxygen-deficient Ta-oxide layer 105 is 71%, and is 2.47 in terms of y when the second oxygen-deficient Ta-oxide layer 105 is represented by $TaO_y$. That is, the second oxygen-deficient Ta-oxide layer 105 is in a higher resistance state than the first oxygen-deficient Ta-oxide layer 104.

Thereafter, the top electrode 107 is formed above the second oxygen-deficient Ta-oxide layer 105. Here, the top electrode 107 has a stacked structure including a platinum (Pt) thin-film layer and a TiAlN layer. The platinum (Pt) thin-film layer is formed by a sputtering method, and the platinum (Pt) thin-film layer is deposited so as to have a film thickness of 15 nm in the present embodiment. The TiAlN layer is also formed by the sputtering method and a film thickness thereof is 100 nm.

The above described process fabricates the nonvolatile memory element 100 in which the variable resistance layer 106 using the oxygen-deficient Ta-oxide is sandwiched between the bottom electrode 103 and the top electrode 107.

It should be noted that, preferably, the top electrode 107 comprises one or more materials a standard electrode potential of which is higher than a standard electrode potential of a transition metal M included in the variable resistance layer, for example, Au (gold), Pt (platinum), Ir (iridium), Pd (palladium), Cu (copper), Ag (silver), and the like, and the bottom electrode 103 comprises a material (for example, W, Ni, TaN, or the like) a standard electrode potential of which is lower than a standard electrode potential of a material included in the top electrode 107.

That is, preferably, $V_1-V_{Ta}$, which is a difference between a standard electrode potential $V_1$ of the bottom electrode 103 and a standard electrode potential $V_{Ta}$ of tantalum which is included in the variable resistance layer, and $V_2-V_{Ta}$, which is a difference between a standard electrode potential $V_2$ of the top electrode 107 and the standard electrode potential $V_{Ta}$ of tantalum, satisfy the relationship $0<V_1-V_{Ta}<V_2-V_{Ta}$.

Moreover, preferably, $V_1-V_{Ta}$, which is the difference between the standard electrode potential $V_1$ of the bottom electrode 103 and the standard electrode potential $V_{Ta}$ of tantalum, and $V_2-V_{Ta}$, which is the difference between the standard electrode potential $V_2$ of the top electrode 107 and the standard electrode potential $V_{Ta}$ of tantalum, satisfy the relationship $V_1-V_{Ta} \leq 0 < V_2-V_{Ta}$.

Such structure allows the resistance change phenomenon to stably occur in the second transition metal oxide layer in contact with the top electrode 107.

[Held Low Resistance State]

The resistance change is caused by applying an electrical pulse signal between the bottom electrode 103 and the top electrode 107 of the nonvolatile memory element 100 fabricated as described above. The following will describe a case where a voltage pulse as an electrical pulse signal is applied. It should be noted that, besides a voltage pulse, the electrical pulse may be a current pulse. Moreover, the electrical pulse signal may be any pulse insofar as the pulse generates a voltage corresponding to the following description.

It should be noted that, hereinafter, the polarity of the voltage is expressed based on the bottom electrode 103. That is, the polarity of a voltage, applied to the top electrode 107, that is high to the bottom electrode 103 is expressed as positive, and, in contrast, the polarity of a voltage, applied to the top electrode 107, that is low to the bottom electrode 103 is expressed as negative.

Moreover, hereinafter, that the resistance state of the nonvolatile memory element 100 changes from the low resistance state to the high resistance state will be denoted as a resistance change to the high resistance state (or RH writing), and that the resistance state of the nonvolatile memory element 100 changes from the high resistance state to the low resistance state will be denoted as a resistance change to the low resistance state (or RL writing).

If the top electrode 107 of the nonvolatile memory element 100 fabricated as described above is given a voltage which has a positive polarity based on the bottom electrode 103 and amplitude equal to or greater than a first threshold voltage, the resistance state of the nonvolatile memory element 100 changes to the high resistance state. If the top electrode 107 is given a voltage which has a negative polarity based on the bottom electrode 103 and amplitude equal to or greater than the second threshold voltage, the resistance state of the nonvolatile memory element 100 changes to the low resistance state.

Figure 2:
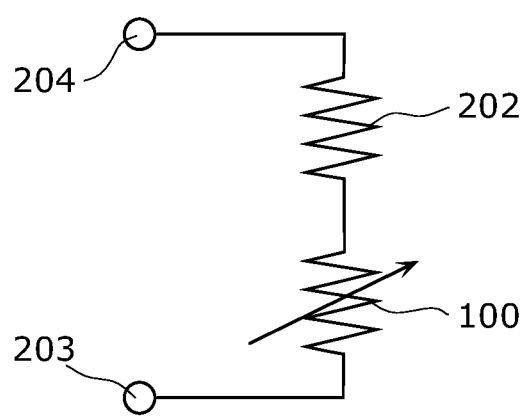
FIG. 2 is a circuit diagram when a voltage pulse is applied to the nonvolatile memory element according to the first embodiment of the present invention.

In the present embodiment, as shown in FIG. 2, the voltage application is carried out in a state in which a circuit resistance 202 of 5 kΩ is connected in series with the variable resistance nonvolatile memory element 100. That is, electrical pulses having voltages, pulse widths of which are 100 ns and amplitudes of which are +3.0V and −2.5V, are alternately applied to a terminal 203 and a terminal 204 which are shown in FIG. 2.

Here, the circuit resistance 202 is an electrical element which has a resistance component and is connected assuming the nonvolatile memory element in use. In use, the variable resistance nonvolatile memory element is not solely used but is used in a state in which a transistor or diode having a certain amount of resistance value is in connection therewith. In addition, there is not a little resistance caused by the lines. Therefore, the circuit resistance 202 is connected assuming these external load resistances which occur when the variable resistance nonvolatile memory element is in use.

It should be noted that each resistance value after the application of a voltage for the resistance change as described above is separately obtained by measuring a current flowing due to the application of a voltage as small as 50 mV. It should be noted that the resistance change does not occur by the application of the voltage as small as 50 mV.

Figure 3B:
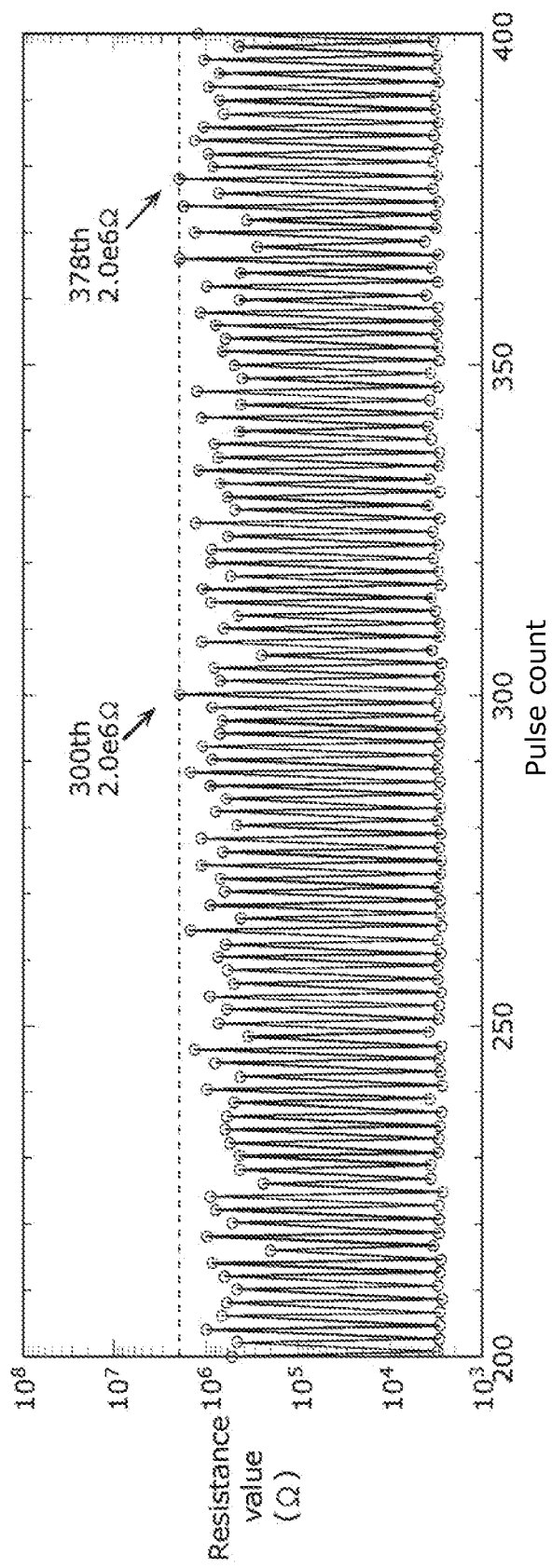
FIG. 3B is a diagram showing relationship between the resistance value of the nonvolatile memory element according to the first embodiment of the present invention and the number of times the voltage pulse is applied.

FIG. 3A shows how the resistance value changes when voltage pulses of +3.0 V and −2.5 V are alternately applied to the nonvolatile memory element 100 in the initial state, being connected with the circuit resistance 202 of 5 kΩ. In the figure, resistance values at odd-numbered pulse applications indicate resistance values changed as a result of application of the voltage pulse of −2.5 V to the element, and resistance values at even-numbered pulse applications indicate resistance values changed as a result of application of the voltage pulse of +3.0 V to the element. It should be noted that the resistance value of one nonvolatile memory element 100 is indicated on the vertical axis in the figure.

First, the element in the initial state (a point at which the number of times the pulse is applied is 0) has the resistance value of about $5 \times 10^7 \Omega$. The voltage pulse of −2.5 V is first applied to the element in this state. Then, the resistance value of the element changes to about $2 \times 10^4 \Omega$. Next, the voltage pulse of +3.0 V is applied to the element, and then the resistance value of the element changes to $3 \times 10^7 \Omega$. The element operates unstably, until the pulse is applied about ten times. However, a relatively stable resistance change occurs after the ten times.

However, when the voltage pulse of +3.0 V is applied to the element at 24th pulse, the resistance value of the element extremely increases ($4.0 \times 10^6 \Omega$), and when the voltage pulse of −2.5 V is next applied to the element, the element changes to the low resistance state (about 3,000Ω). However, when the voltage pulse of +3.0 V as 26th pulse is applied to the element, the resistance change to the high resistance state does not occur. That is, a held low resistance state is present. Then, the voltage pulse of −2.5 V as 27th pulse is applied to the element and the voltage pulse of +3.0 V as 28th pulse is applied to the element, and thereby the resistance change to the high resistance state occurs and the resistance value of the element turns to be $1.5 \times 10^5 \Omega$.

Thereafter, a relatively stable resistance change occurs. However, the resistance change to the high resistance state occurs at 54th pulse (+3.0 V) and the resistance change to the low resistance state occurs at 55th pulse application (−2.5 V), and then the held low resistance state is present without allowing the resistance change to the high resistance state. Furthermore, it can be seen that the low resistance state occurs after the pulse application at 72nd, 156th, and 180th (all, +3.0 V).

[Method for Preventing Held Low Resistance State]

Referring back to FIG. 3A, one notes that the resistance values (the resistance values at 24th, 54th, 72nd, 156th, and 180th) in the high resistance state that are each immediately prior to the occurrence of the held low resistance state are relatively high. That is, the held low resistance state occurs after the resistance value in the high resistance state is equal to or greater than about $2.0 \times 10^6 \Omega$. It should be noted that, hereinafter, the resistance value in the high resistance state will be denoted as a high resistance value and the resistance value in the low resistance state will be denoted as a low resistance value.

Therefore, after 200th pulse, if the high resistance value is equal to or greater than $2.0 \times 10^6 \Omega$, the subsequent resistance change to the low resistance state is caused by applying to the element the voltage pulse of $-2.0$ V instead of the voltage pulse of $-2.5$ V. In the range shown in FIG. 3B, the resistance value exceeds $2.0 \times 10^6 \Omega$ when 300th pulse and 378th pulse are applied. With respect to these two points, the voltage of $-2.0$ V is subsequently applied to the element to change the resistance state of the element to the low resistance state (the resistance state of the element is changed to the low resistance state using the voltage of $-2.5$ V as with FIG. 3A, except for these two points). The held low resistance state then does not occur, and the resistance change occurs well between the high resistance state and the low resistance state.

Figure 3C:
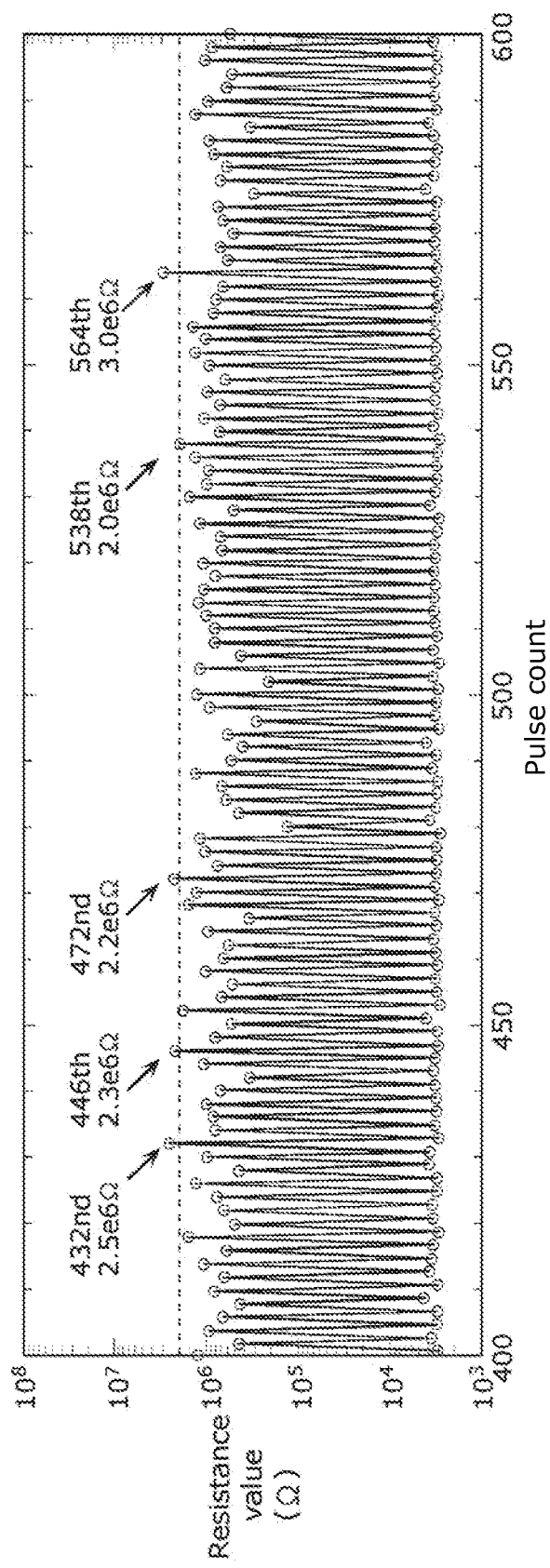
FIG. 3C is a diagram showing relationship between the resistance value of the nonvolatile memory element according to the first embodiment of the present invention and the number of times the voltage pulse is applied.
Figure 3D:
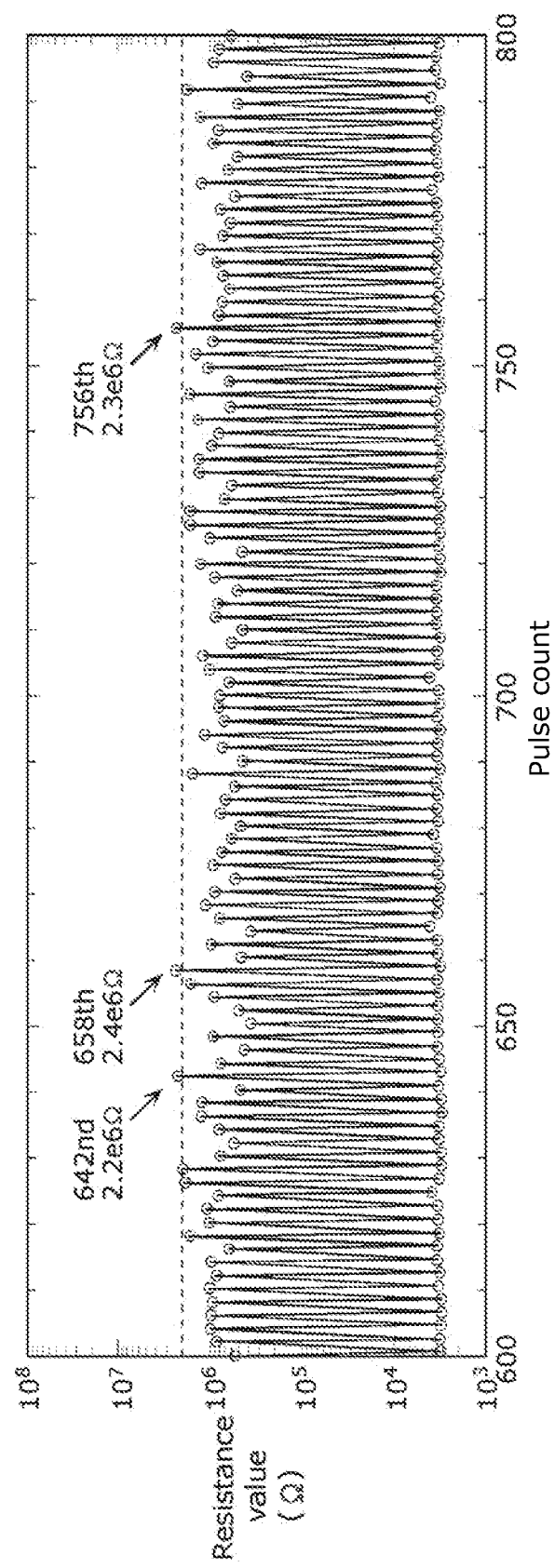
FIG. 3D is a diagram showing relationship between the resistance value of the nonvolatile memory element according to the first embodiment of the present invention and the number of times the voltage pulse is applied.

FIG. 3C shows resistance changes at 400th to 600th. Moreover, FIG. 3D shows resistance changes at 600th to 800th. In the ranges shown in these figures, the high resistance value is equal to or greater than $2.0 \times 10^6 \Omega$ when the voltage pulse of $+3.0$ V is applied at 432nd, 446th, 472nd, 538th, 564th, 642nd, 658th, and 756th. Thus, the voltage of $-2.0$ V is applied at 433rd, 447th, 473rd, 539th, 565th, 643rd, 659th, and 757th to change the resistance state of the element to the low resistance state. Unlike as shown in FIG. 3A, no held low resistance state occurs all in these instances as well.

Figure 3E:
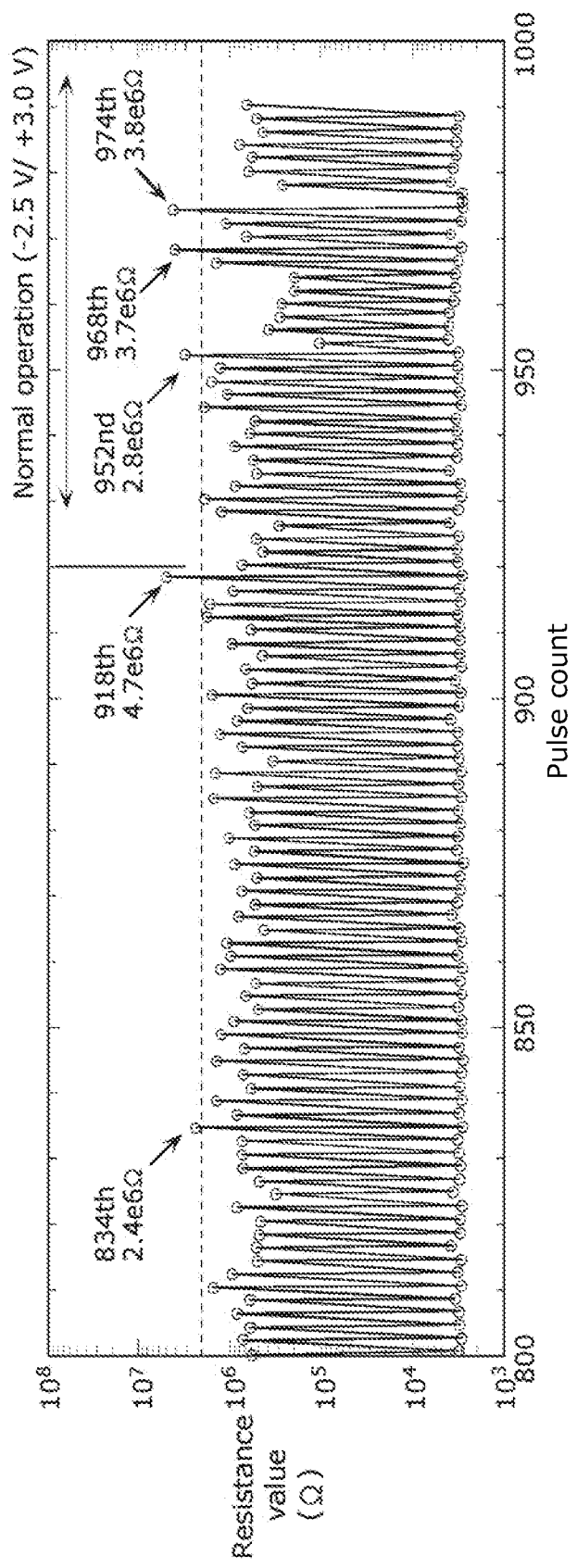
FIG. 3E is a diagram showing relationship between the resistance value of the nonvolatile memory element according to the first embodiment of the present invention and the number of times the voltage pulse is applied.

Moreover, likewise, when the high resistance value is equal to or greater than $2.0 \times 10^6 \Omega$ in the range from 800th to 920th shown in FIG. 3E, the subsequent resistance change to the low resistance is caused by applying the voltage pulse of $-2.0$ V to the element. That is, since the high resistance value exceeds $2.0 \times 10^6 \Omega$ when the pulse is applied at 834th and 918th, the subsequent resistance change to the low resistance state is caused using the voltage of $-2.0$ V. In this case also, no held low resistance state occurs.

Next, after 920th shown in FIG. 3E, in the same manner as when data shown in FIG. 3A is obtained, the voltages of $-2.5$ V and $+3.0$ V are alternately applied mechanically (even if the high resistance value is equal to or greater than $2.0 \times 10^6 \Omega$, the subsequent resistance change to the low resistance state is caused by applying the voltage pulse of $-2.5$ V to the element). Then, first, the resistance value turns to be $2.8 \times 10^6 \Omega$ at 952nd due to the application of the voltage pulse of $+3.0$ V. Then, the resistance change to the low resistance state occurs without any problem when the voltage pulse of $-2.5$ V is applied at 953rd. However, the resistance value remains a relatively low resistance value when the voltage pulse of $+3.0$ V is applied at 954th. That is, although the held phenomena does not occur, insufficient resistance change to the high resistance state is present. Next, when the voltage pulse of $+3.0$ V is applied at 968th, the resistance value is $3.8 \times 10^6 \Omega$, but the held low resistance state does not occur. However, when the voltage pulse of $+3.0$ V is applied at 974th, the resistance value exceeds $2.0 \times 10^6 \Omega$ and the held low resistance state occurs immediately thereafter.

From the above results, it is clear that when the high resistance value exceeds a predetermined threshold value ($2.0 \times 10^6$ in the example shown in the present embodiment), the subsequent resistance change to the low resistance state is caused using a lower voltage (a voltage which is small in absolute terms) than the voltage of the pulse for the normal resistance change to the low resistance state, thereby inhibiting the held low resistance state.

Figure 4:
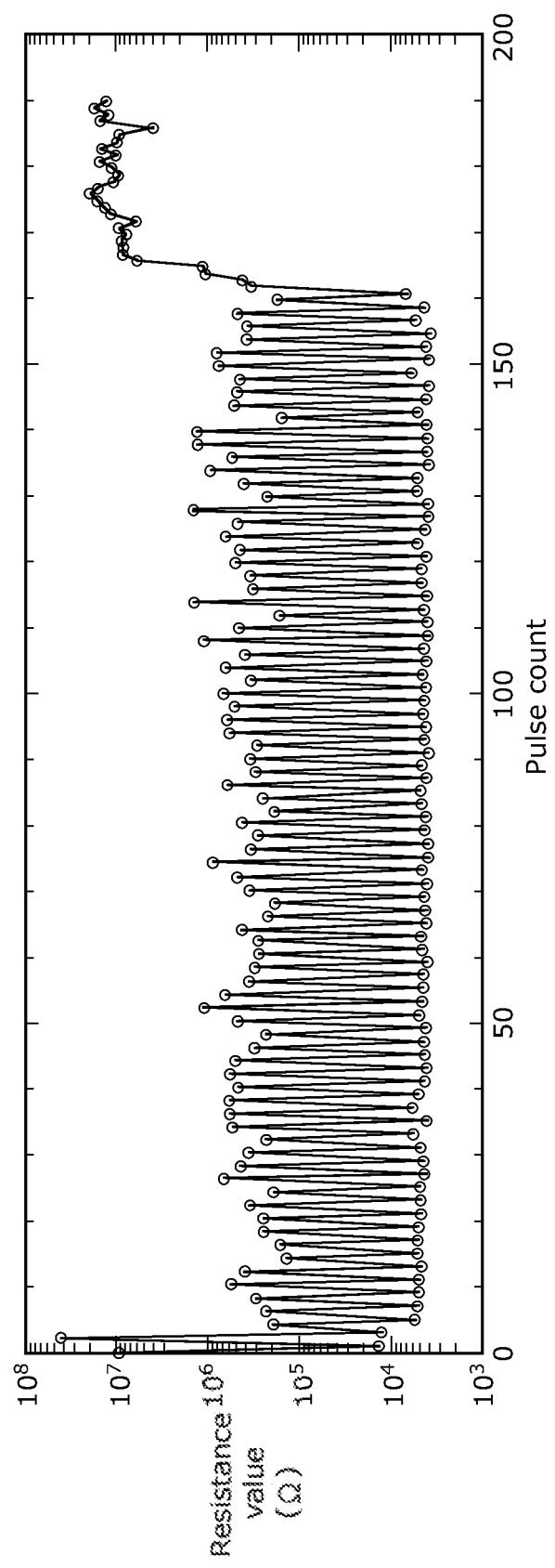
FIG. 4 is a diagram showing relationship between the resistance value of the nonvolatile memory element according to the first embodiment of the present invention and the number of times the voltage pulse is applied.

In the above-described example, a normal operation of the resistance change is performed by applying voltages of $-2.5$ V (for resistance change to the low resistance state) and $+3.0$ V (for resistance change to the high resistance change), and only when the high resistance value exceeds $2.0 \times 10^6 \Omega$, the resistance change to the low resistance state is caused by applying the voltage pulse of $-2.0$, to prevent the held low resistance state from occurring. Thus, verification is carried out regarding the resistance change when the normal operation is performed using voltages of $-2.0$ V and $+3.0$ V. A result from the verification is shown in FIG. 4. It should be noted that a sample used here is a different sample from the sample used to obtain the data shown in FIG. 3A to FIG. 3E but is fabricated in exactly the same manner (a different sample cut out of a same wafer).

In the view of the figure, the initial resistance of the element is about $1 \times 10^7 \Omega$, and the resistance state of the element changes to the low resistance state by the application of the voltage pulse of $-2.0$ V. While variation in resistance value is initially large, the resistance state of the element changes to the high resistance state by the application of the voltage pulse of $+3.0$ V and changes to the low resistance state by the application of the voltage pulse of $-2.0$ V, thereby causing the resistance change relatively well. However, after the resistance state of the element changes to the high resistance state by the application of the voltage pulse ($+3.0$ V) at 163rd, the resistance state of the element does not change to the low resistance state at 164th even though the voltage pulse of $-2.0$ V is applied to the element. Thereafter, the resistance change to the low resistance state does not occur although the voltage pulses of $+3.0$ V and $-2.0$ V are alternately applied, and thus what is called the held high resistance state undesirably occurs. As described above, it is found that if the magnitude of the voltage for the resistance change to the low resistance state is reduced for the purpose of inhibiting the held low resistance state, the held high resistance state undesirably occurs.

From the result, it is found that, to inhibit the held low resistance state, a method is effective in which voltages sufficient to allow resistance change to the high resistance state and the low resistance state are applied ($-2.5$ V and $+3.0$ V from the result shown in FIG. 2) under normal operation, and only when the high resistance value has exceeded a predetermined threshold value ($2.0 \times 10^6$ in the examples shown in FIG. 3A to FIG. 3E), the subsequent resistance change to the low resistance state is caused using a lower voltage (a voltage which is small in absolute terms) than the voltage of the pulse for the normal resistance change to the low resistance state.

[Mechanism of Prevention of Held Low Resistance State]

Next, why the held low resistance state occurs and how the above-described method can inhibit the held low resistance state will briefly be described.

Figure 5A:
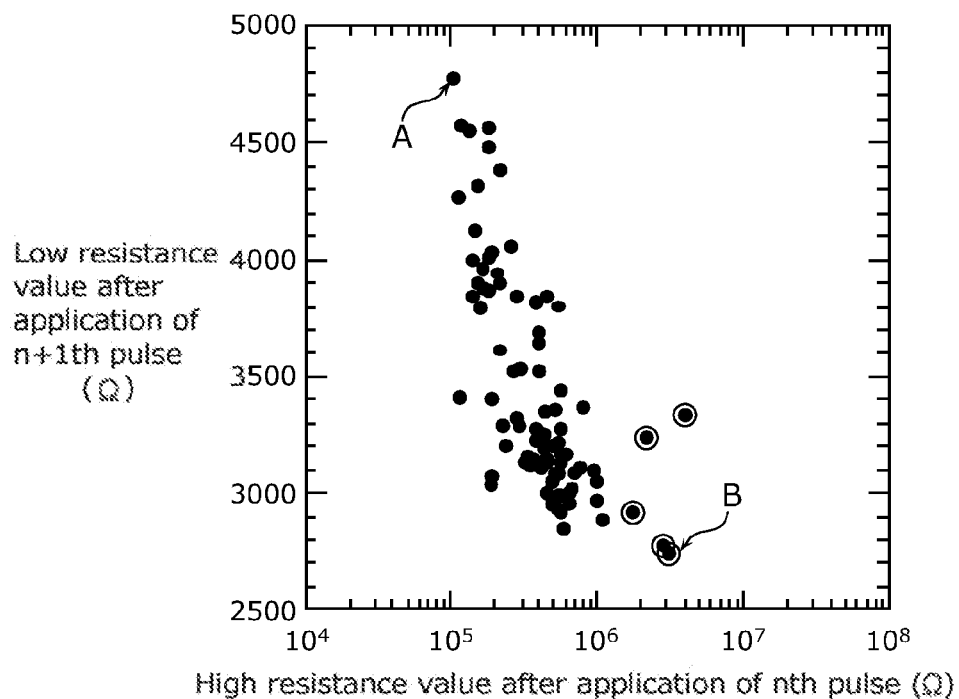
FIG. 5A is a diagram showing correlation between the resistance values of the nonvolatile memory element according to the first embodiment of the present invention in a high resistance state and a low resistance state.

First, a state immediately prior to the occurrence of the held phenomena in FIG. 3A will be reviewed. FIG. 5A is a result from re-plotting the data shown in FIG. 3A. In the figure, the resistance value (the high resistance value) in the high resistance state is indicated on the horizontal axis and the resistance value (the low resistance value) in the subsequent low resistance state is indicated on the vertical axis. That is, FIG. 5A shows correlation between the high resistance value and the low resistance value when the resistance change is caused by application of the electrical pulses. For example, data denoted by a dot A in the figure means that when a sample in the high resistance state of about $10^5 \Omega$ is changed to be in the low resistance state by having applied thereto the voltage of $-2.5$ V, the resistance value changes to about $4,770 \Omega$. It should be noted that FIG. 5A is a result of re-plotting the data shown in FIG. 3A at the 11th pulse to the 200th pulse, and data at points where the held phenomena undesirably occurs are excluded. Also, in this figure, dots enclosed by circle indicate that the held phenomenon occurs immediately thereafter. For example, data B in the figure indicates that the high resistance value is $3 \times 10^6 \Omega$, the next low resistance value is about $2,700\Omega$, and the subsequent resistance change to the high resistance state is not successful, causing the held phenomena to occur.

In the view of the data, characteristics showing the relationship between the high resistance value and the subsequent low resistance value have a tendency of negative slope as an overall tendency. This indicates that if the high resistance value is high, the subsequent low resistance value decreases. In addition, data immediately prior to the occurrence of the held phenomena is located exclusively in a lower right region. That is, it can be seen that in the case where an increase of the high resistance value above a certain value decreases the subsequent low resistance value below another certain value, the held phenomena eventually occurs.

Figure 5B:
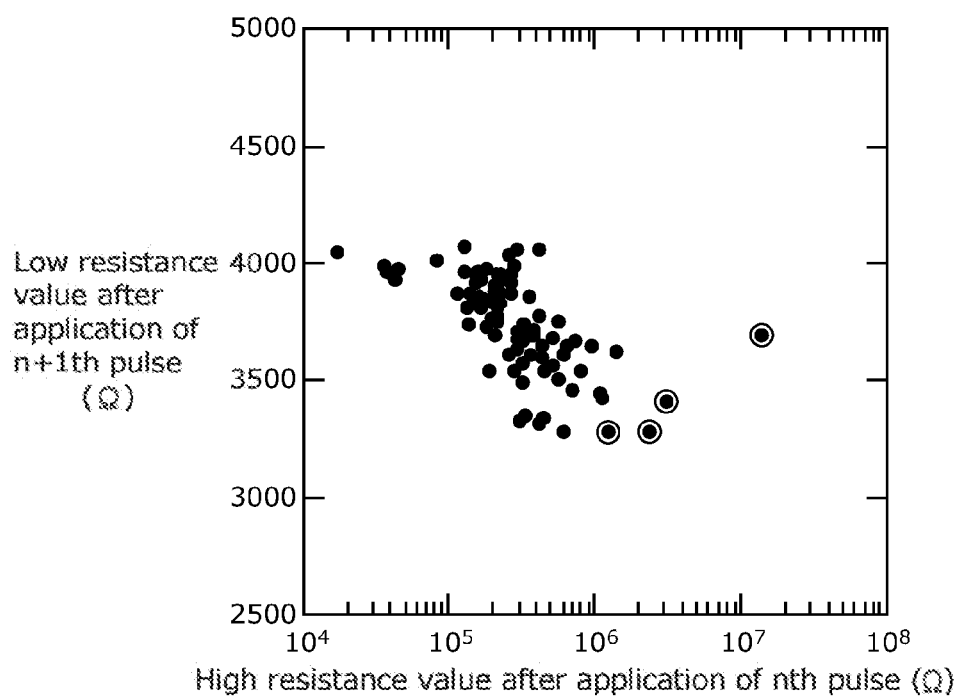
FIG. 5B is a diagram showing correlation between the resistance values of the nonvolatile memory element according to the first embodiment of the present invention in the high resistance state and the low resistance state.

Moreover, the same analysis is made on a sample other than the samples from which the data shown in FIG. 3A to FIG. 3E is obtained. One example of which is shown in FIG. 5B. The sample from which the data is obtained has a similar structure as the samples from which the data shown in FIG. 3A to FIG. 3E is obtained. Also in the figure, the characteristics of the data have an overall tendency of negative slope. It can be seen that the high resistance value immediately prior to the occurrence of the held phenomena is very high and the subsequent low resistance value is low. That is, it can be seen that the phenomena, in which the low resistance value decreases after the high resistance value increases above a certain value and subsequently the held phenomena occurs, is not a phenomena unique to the samples from which the data shown in FIG. 3A to FIG. 3E is obtained.

It is presumable that why the held phenomena occurs after such processes can be explained by difference in how the voltage is applied to the nonvolatile memory element 100 when applying the voltage pulse.

As described above, in the present embodiment, as shown in FIG. 2, the resistance change is caused by applying a voltage between the terminal 203 and the terminal 204 in the state in which the circuit resistance 202 is connected in series with the nonvolatile memory element 100. In this case, the voltage applied to the nonvolatile memory element 100 satisfies $R1/(R1+R2) \times V$, where the voltage applied between the terminal 203 and the terminal 204 is represented by V, the resistance value of the nonvolatile memory element 100 is represented by R1, and the resistance value of the circuit resistance 202 is represented by R2. The equation means that higher the resistance value R1 of the nonvolatile memory element 100 is, a larger voltage is applied to the nonvolatile memory element 100.

At present, considering a case where the nonvolatile memory element 100 in the high resistance state is changed to be in the low resistance state by having applied thereto a negative voltage, higher the high resistance value is, a larger negative voltage is applied to the nonvolatile memory element 100. Then, the resistance state of the nonvolatile memory element 100 undesirably changes to the low resistance state to an excessive extent due to the large negative voltage. When the positive voltage pulse for resistance change to the high resistance state is applied to the nonvolatile memory element 100 the resistance state of which has undesirably changed to the low resistance state to the excessive extent, a large partial pressure of a certain degree is applied to the circuit resistance 202 instead, ending up in a situation where the voltage is not effectively applied to the nonvolatile memory element 100. It is considered that, as a result, the resistance state of the nonvolatile memory element 100 does not change to the high resistance state, ending up the nonvolatile memory element 100 holding onto the low resistance state.

Therefore, to prevent the held low resistance state, the nonvolatile memory element 100 may be prevented from ending up in a situation where the low resistance state is excessive. The method for programming the nonvolatile memory element 100 described in the present embodiment is nothing but a method for achieving this. That is, when the high resistance value of the nonvolatile memory element 100 is undesirably high above a predetermined threshold value for causing the held low resistance state, the subsequent resistance change to the low resistance state is caused by applying, to the terminal 203 and the terminal 204, a negative voltage an absolute value of which is smaller than an absolute value of the normal low resistance writing voltage, and thereby the nonvolatile memory element 100 is prevented from having an excessively small resistance value. As a result, the prevention of the held low resistance state is possible.

[Others]

In the above-described embodiment, while the magnitudes of voltages of the electrical pulses for causing the resistance change (a first low resistance writing voltage and a first high resistance writing voltage) are $-2.5$ V and $+3.0$, respectively, the magnitudes of the voltages are not limited thereto.

Moreover, while the widths of the voltage pulse are 100 ns, the pulse widths are not limited thereto. In fact, the samples used in the above-described embodiment are operable having the pulse widths of about 20 ns or about 100 µs.

Moreover, the threshold value of the resistance value in the high resistance state is $2 \times 10^6 \Omega$ and if the threshold value is exceeded, the voltage (a second low resistance writing voltage) of the electrical pulse, which is applied for the resistance change to the low resistance state, is $-2.0$ V. However, the threshold value and the value of applied voltage are not limited to these values. It should be noted that these values are determined based on the characteristics of the nonvolatile memory element 100.

Moreover, while, in the above, one voltage pulse for the resistance change to the high resistance state and one voltage pulse for the resistance change to the low resistance state are applied accordingly, each voltage pulse may be divided into plurality and applied accordingly.

That is, the high resistance writing voltage, the first low resistance writing voltage, the second low resistance writing voltage, the threshold value of the high resistance value at which the held low resistance state occurs, and the like change depending on the variable resistance material, the film thickness thereof, the structure and the size of the variable resistance element, and the like. The threshold values need to be experimentally obtained in consideration of the yield rate and the reliability.

Moreover, in the above-described embodiment, while the variable resistance layer 106 includes two layers, the present invention is not limited thereto. For example, the first oxygen-deficient Ta-oxide layer may be a multi-layered oxygen-deficient Ta-oxide layer having different resistance values, or may have a structure in which the oxygen concentration continuously varies in the first oxygen-deficient Ta-oxide layer. That is, the variable resistance layer 106 may include at least two oxide layers comprising oxygen-deficient transition metals having different oxygen concentrations. Moreover, among the at least two oxide layers, an oxide layer having a highest oxygen concentration may be in contact with the top electrode 107 or the bottom electrode 103.

Moreover, the variable resistance layer 106 may include metal impurities or gas atom impurities that are introduced during the manufacturing process. Moreover, for purposes of fine adjustment of the resistance value, the variable resistance layer 106 may intentionally be mixed with a small amount of impurities. For example, addition of nitrogen to the variable resistance layer 106 increases the resistance value of the variable resistance layer, thereby improving the reactivity of the resistance change.

Therefore, in the nonvolatile memory element using the oxygen-deficient transition metal oxide as the variable resistance layer, if the variable resistance layer has a first region comprising a first transition metal oxide which is of the oxygen-deficient and has a composition represented by $MO_x$, and a second region comprising a second transition metal oxide having a composition represented by $MO_y$, (where, $x<y$), the first region and the second region cannot be prevented from including predetermined impurities (for example, additives for the adjustment of the resistance value) in addition to the transition metal oxides having the corresponding compositions.

Moreover, upon forming a resistance film by sputtering, a trace mount of element is unintentionally introduced into the resistance film due to a residual gas or release of gas from vacuum chamber walls. However, the case where such a trace mount of element is introduced into the resistance film is, of course, included in the scope of the present invention.

Furthermore, in the embodiment described above, while the characteristics of the nonvolatile memory element using the oxygen-deficient Ta-oxide are described, the present invention is not limited thereto. That is, it is considered, based on the above-described mechanism, that the present invention is effective on any element insofar as the variable resistance nonvolatile memory elements may be changed the resistance state to the low resistance state to the excessive extent. In particular, it is considered that the present invention is effective on the nonvolatile memory elements showing a bipolar switching operation in which the resistance changes depending on the application of voltages having different polarities.

Moreover, in addition to the Ta-oxide of the present embodiment, examples of a material that allows achievement of the nonvolatile memory element as described above include a transition metal oxide. For example, other than the Ta-oxide described above, there is a nonvolatile memory element using a hafnium (Hf) oxide. Moreover, it is considered that the method according to the present invention can inhibit the held low resistance state even in the case of a variable resistance nonvolatile memory element using the oxygen-deficient oxide comprising a transition metal such as nickel (Ni), niobium (Nb), titanium (Ti), zirconium (Zr), cobalt (Co), iron (Fe), copper (Cu), chromium (Cr), or the like insofar as the variable resistance layer has a stacked structure including a layer having a high oxygen concentration and a layer having a low oxygen concentration.

For example, when employing a stacked structure comprising hafnium oxides, and a composition of a first hafnium oxide is represented by $HfO_x$ and a composition of a second hafnium oxide is represented by $HfO_y$, preferably, a condition about $0.9 \leq x \leq$ about 1.6 is satisfied, y satisfies about $1.8<y$, and a film thickness of the second hafnium oxide is equal to or greater than 3 nm and equal to or less than 4 nm.

Moreover, when employing a stacked structure comprising zirconium oxides, and a composition of a first zirconium oxide is represented by $ZrO_x$ and a composition of a second zirconium oxide is represented by $ZrO_y$, preferably, a condition about $0.9 \leq x \leq$ about 1.4 is satisfied, y satisfies about $1.9<y$, and a film thickness of the second zirconium oxide is equal to or greater than 1 nm and equal to or less than 5 nm.

Moreover, in the case of the hafnium oxides, the first hafnium oxide layer is formed above the bottom electrode by what is called a reactive sputtering method in which an Hf target is used and sputtered in argon gas and oxygen gas. After the formation of the first hafnium oxide layer, the second hafnium oxide layer is formed by exposing a surface of the first hafnium oxide layer to the plasma comprising argon gas and oxygen gas. An oxygen content percentage of the first hafnium oxide layer can readily be adjusted, in the same manner as with the above-described the tantalum oxide, by changing a ratio of the oxygen gas flow rate to argon gas during the reactive sputtering. It should be noted that the substrate is not necessarily heated and may have a room temperature.

In the case of the zirconium oxides, the first zirconium oxide layer is formed above the bottom electrode by what is called a reactive sputtering method in which a Zr target is used and sputtered in argon gas and oxygen gas. After the formation of the first zirconium oxide layer, the second zirconium oxide layer can be formed by exposing a surface of the first zirconium oxide layer to the plasma comprising argon gas and oxygen gas. An oxygen content percentage of the first zirconium oxide layer can readily be adjusted, in the same manner as with the above-described tantalum oxide, by changing a ratio of the oxygen gas flow rate to argon gas during the reactive sputtering. It should be noted that the substrate is not necessarily heated and may have a room temperature.

Second Embodiment

In a second embodiment of the present invention, a nonvolatile memory device having applied thereto a method for programming the nonvolatile memory element set forth in the first embodiment will be described.

Figure 6:
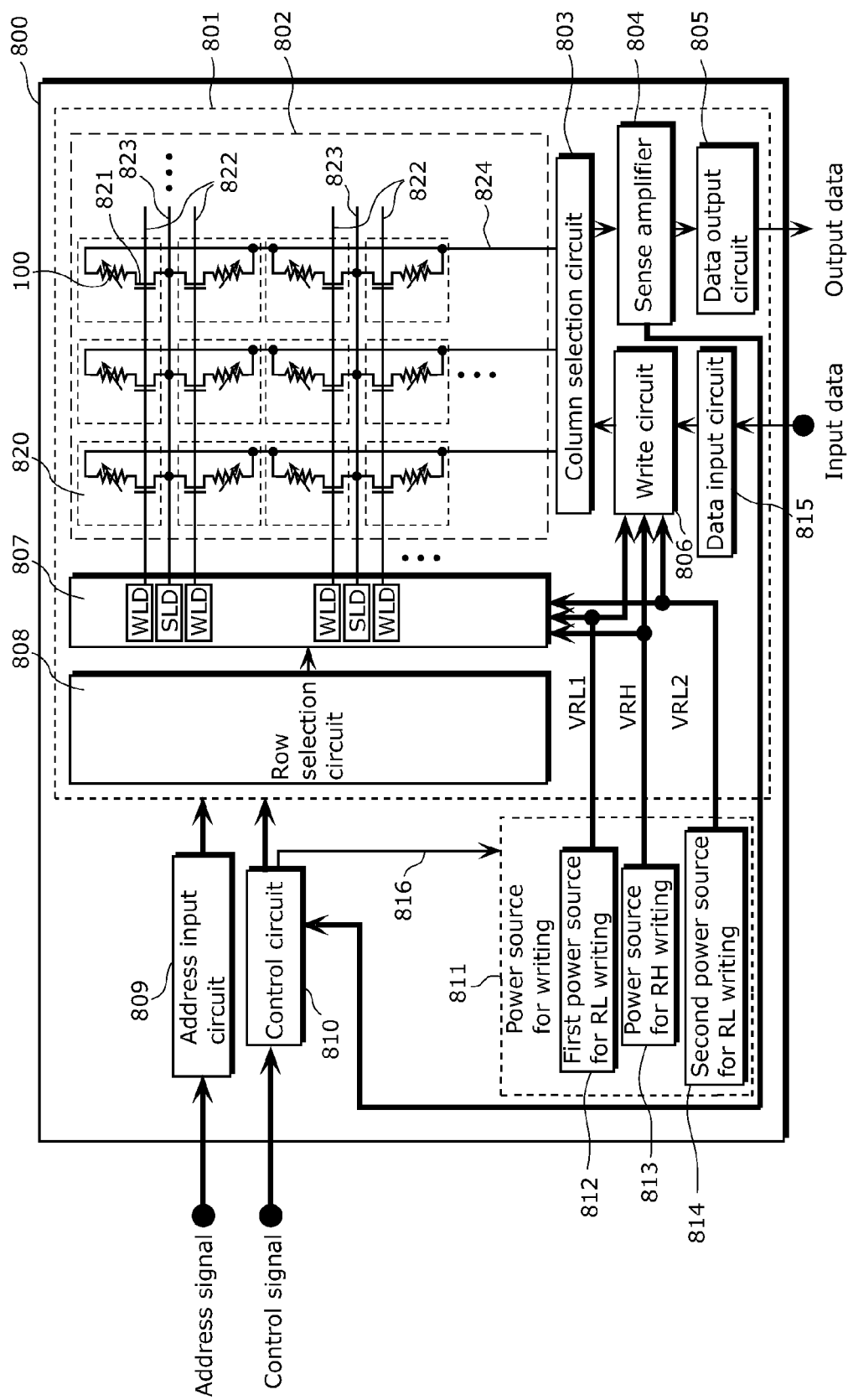
FIG. 6 is a diagram showing an example of a circuit structure of a nonvolatile memory device according to a second embodiment of the present invention.

FIG. 6 is a diagram showing a structure of a nonvolatile memory device 800 according to the second embodiment of the present invention.

The nonvolatile memory device 800 shown in FIG. 6 includes a memory main portion 801, an address input circuit 809, a control circuit 810, and a power source 811 for writing. Moreover, the memory main portion 801 includes a memory array 802, a column selection circuit 803, a sense amplifier 804, a data output circuit 805, a write circuit 806, a row driver 807, a row selection circuit 808, and a data input circuit 815.

The memory array 802 includes a plurality of memory cells 820 disposed in row and column directions, word lines 822 each provided on every row, and bit lines 824 each provided on each column. Source lines 823 in FIG. 6 are each provided on every two rows. However, the source lines 823 may each be provided on each row, or may be provided in the column direction so as to be common source lines for transistors common in the column direction. In this case, a source line driver circuit SLD is disposed to a column selection circuit side.

Each memory cell 820 includes the nonvolatile memory element 100 and a transistor 821 connected in series with each other.

It should be noted that while FIG. 6 shows what is called an 1T1R memory cell in which one transistor 821 is connected in series with one nonvolatile memory element 100 in one memory cell 820, what is called an 1D1R memory cell may be employed in which one diode is connected in series with one nonvolatile memory element in one memory cell. In this case, the memory cell 820 has two terminals and the bit line or the word line is connected to the respective terminals. Moreover, the source lines and a source driver circuit SLD are unnecessary.

The nonvolatile memory element 100 is the nonvolatile memory element that is described in the first embodiment.

One of the top electrode 107 and the bottom electrode 103 of the nonvolatile memory element 100 is electrically connected with the bit line 824 on the corresponding column, and the other is electrically connected with the source line 823 on the corresponding row via the transistor 821. Moreover, a gate of the transistor 821 is connected with the word line 822 on the corresponding row.

It should be noted that, hereinafter, if the nonvolatile memory element 100 included in the memory cell 820 is in the high resistance state, it will be denoted that the resistance state of the memory cell 820 is the high resistance state. Likewise, if the nonvolatile memory element 100 included in the memory cell 820 is in the low resistance state, it will be denoted that the resistance state of the memory cell 820 is the low resistance state.

Hereinafter, the roles of primary circuits included in the nonvolatile memory device 800 will briefly be described.

The address input circuit 809 receives an address signal inputted from an external device and, based on the address signal, generates a row address signal and a column address signal. Moreover, the address input circuit 809 supplies the generated row address signal to the row selection circuit 808, and supplies the generated column address signal to the column selection circuit 803. Here, the address signal is a signal indicating an address of a specific memory cell 820 selected from among a plurality of the memory cells 820.

The row selection circuit 808 receives the row address signal supplied by the address input circuit 809, and, based on the row address signal, controls the row driver 807 so that a predetermined voltage whereby the transistor included in the memory cell is turned ON, and a write voltage or a read voltage for the source lines are applied to the word line 822 and the source line 823, respectively, that are on a row to be selected. Moreover, the row selection circuit 808 controls the row driver 807 so that a predetermined voltage whereby the transistor included in the memory cell is turned OFF is applied to the word line 822 on each of unselected rows.

The column selection circuit 803 receives the column address signal supplied by the address input circuit 809, and, based on the column address signal, applies a write voltage or a read voltage for the bit lines to the bit line 824 on a row to be selected, and applies a non-select voltage to unselected bit lines 824.

Moreover, the sense amplifier 804 broadly has two roles. One role is determining whether the resistance state of the selected memory cell 820 is the low resistance state or the high resistance state and outputting the determination result as a logical result to determine a state of data stored in the memory cell 820. The resultant output data is outputted to the external device via the data output circuit 805. The other role is determining a level (the high resistance value) of the high resistance state. That is, the sense amplifier 804 is responsible to determine whether the high resistance value of the nonvolatile memory element 100 has exceeded a predetermined threshold value for causing the held low resistance state. Moreover, the sense amplifier 804 supplies this information to the control circuit 810.

The write circuit 806 applies, via the data input circuit 815, a write voltage in accordance with input data inputted by the external device, to the bit line 824 selected by the column selection circuit 803.

The power source 811 for writing includes a second power source 814 for low resistance writing (a second power source for RL writing), in addition to a normal power source 813 for high resistance writing (a power source for RH writing) and a first power source 812 for low resistance writing (a first power source for RL writing).

The power source 813 for RH writing generates a high resistance writing voltage VRH which is used in high resistance writing.

The first power source 812 for RL writing generates a first low resistance writing voltage VRL1 which is used in normal low resistance writing.

The second power source 814 for RL writing generates a second low resistance writing voltage VRL2 which is used for the resistance change to the low resistance state when the high resistance value of the nonvolatile memory element 100 has exceeded the predetermined threshold value. Here, an absolute value of the second low resistance writing voltage VRL2 is smaller than an absolute value of the first low resistance writing voltage VRL1.

The control circuit 810 controls the operation of the nonvolatile memory device 800, in accordance with a control signal inputted from outside. Specifically, in a cycle of data writing, the control circuit 810 controls the power source 811 for writing and the write circuit 806 so that data is written to the nonvolatile memory element 100 included in the selected memory cell 820. Here, the control circuit 810 supplies the power source 811 for writing with a voltage setting signal 816 for indicating a voltage level of the voltage pulse in writing. Moreover, the control circuit 810 supplies the write circuit 806 with a write signal for instructing application of the write voltage, in accordance with input data inputted by the data input circuit 815 (not shown).

Specifically, to change the resistance state of the selected memory cell 820 to the high resistance state, the control circuit 810 supplies the write circuit 806 and the row driver 807 with the high resistance writing voltage VRH which is generated by the power source 813 for RH writing, so that a predetermined high resistance writing voltage is applied between the corresponding bit line 824 and source line 823.

On the other hand, to change the resistance state of the selected memory cell 820 to the low resistance state, the control circuit 810 first detects the resistance value of the memory cell 820 using the sense amplifier 804, and determines whether the value exceeds the predetermined threshold value for causing the held low resistance state. If the resistance value of the memory cell 820 is below the threshold value, the control circuit 810 supplies the write circuit 806 and the row driver 807 with the first low resistance writing voltage VRL1 which is generated by the first power source 812 for RL writing, so that a predetermined first low resistance writing voltage is applied between a corresponding bit line 824 and a corresponding source line 823. In contrast, if the resistance value of the memory cell 820 has exceeded the threshold value, the control circuit 810 supplies the write circuit 806 and the row driver 807 with the second low resistance writing voltage VRL2 which is generated by the second power source 814 for RL writing, so that a predetermined second low resistance writing voltage is applied between a corresponding bit line 824 and a corresponding source line 823. Here, the amplitude of the first low resistance writing voltage is greater than the amplitude of the second low resistance writing voltage.

According to the structure as described above, the nonvolatile memory device 800 according to the present embodiment allows prevention of the held low resistance state of the variable resistance nonvolatile memory element 100 included in the memory cell 820.

It should be noted that, in FIG. 6, the example is given in which the first power source 812 for RL writing and the second power source 814 for RL writing have circuits independent of each other. However, the functionality of the first power source 812 for RL writing and the second power source 814 for RL writing may be implemented using one power supply circuit. For example, the power source 811 for writing may include a variable power supply for selectively generating the first low resistance writing voltage VRL1 and the second low resistance writing voltage VRL2.

Hereinafter, an operation of the nonvolatile memory device 800 according to the present embodiment will be described.

There are a number of methods for programming the nonvolatile memory device 800 shown in FIG. 6 in actual use.

A first method measures the resistance value of the memory cell 820 immediately prior to changing the resistance state of the memory cell 820 to the low resistance state, and selects a low resistance writing voltage, in accordance with the measured result.

A second method measures the high resistance value after write immediately after changing the resistance state of the memory cell 820 to the high resistance state, and, if the measured high resistance value exceeds a predetermined threshold value, changes again the resistance state of the memory cell 820 to the high resistance state so that the high resistance value is a normal value.

Figure 7:
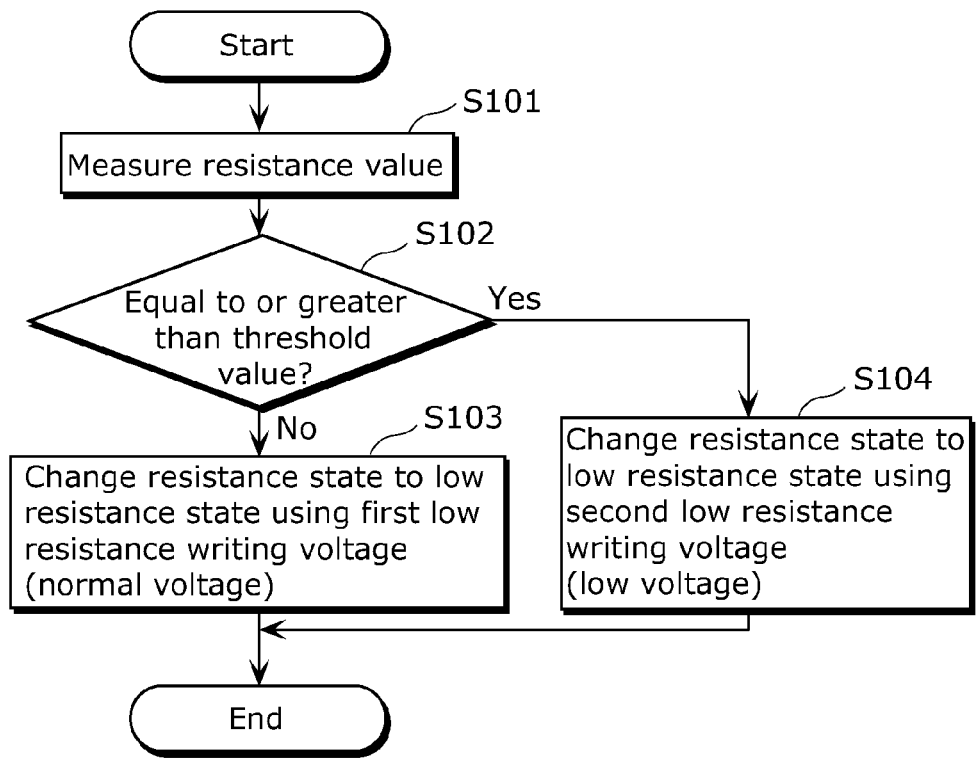
FIG. 7 is a flowchart of an operation by the nonvolatile memory device according to the second embodiment of the present invention.

FIG. 7 shows a flowchart of the first method.

As shown in FIG. 7, upon changing the resistance state of the memory cell 820 to the low resistance state, the control circuit 810 first measures the resistance value of the memory cell 820 which is to be written and in the high resistance state (S101), and determines whether the measured resistance value is equal to or greater than a predetermined threshold value (S102).

If the measured resistance value is less than the threshold value (No in S102), the control circuit 810 changes the resistance state of the memory cell 820 to be written to the low resistance state, using the first low resistance writing voltage VRL1 (S103).

On the other hand, if the measured resistance value is equal to or greater than the threshold value (Yes in S102), the control circuit 810 changes the resistance state of the memory cell 820 to be written to the low resistance state, using the second low resistance writing voltage VRL2 (S104).

Figure 8:
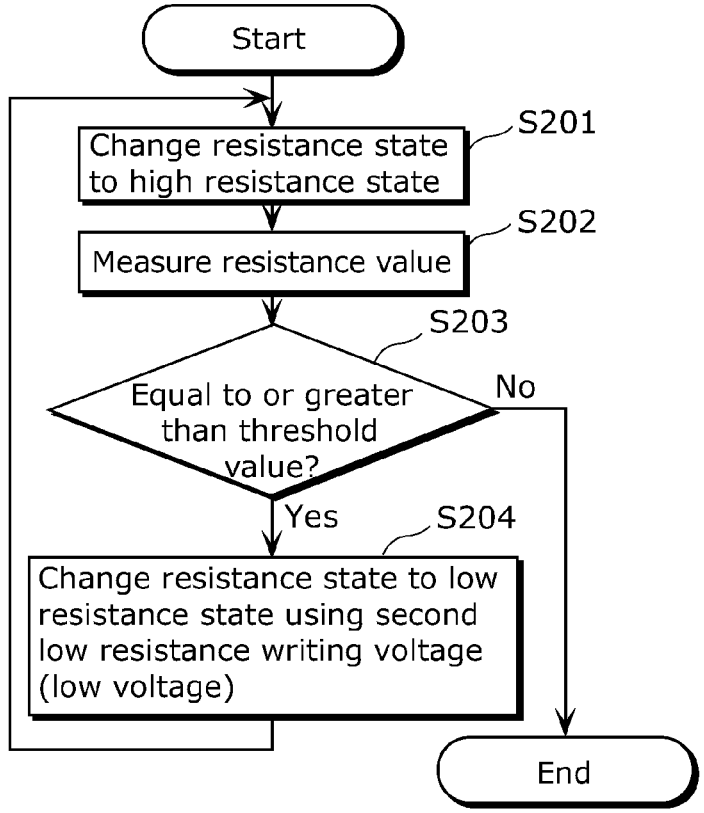
FIG. 8 is a flowchart of another example of the operation by the nonvolatile memory device according to the second embodiment of the present invention.

FIG. 8 is a flowchart illustrating the second method described above.

As shown in FIG. 8, upon changing the resistance state of the memory cell 820 to the high resistance state, the control circuit 810 first changes the resistance state of the memory cell 820 to be written to the high resistance state, using the high resistance writing voltage VRH (S201).

Next, the control circuit 810 measures the resistance value of the memory cell 820 to be written in the high resistance state (S202), and determines whether the measured resistance value is equal to or greater than a predetermined threshold value (S203).

If the measured resistance value is equal to or greater than the threshold value (Yes in S203), the control circuit 810 changes the resistance state of the memory cell 820 to be written to the low resistance state, using the second low resistance writing voltage VRL2 (S204) and then performs again the processes from step S201. That is, the control circuit 810 repeats the processes of steps S201 through S204 until the resistance value is less than the threshold value after the resistance change to the high resistance state (No in S203).

Here, a most important point of the present invention is that if the high resistance value is undesirably large above the predetermined threshold value, a small voltage (a voltage smaller in absolute value than a normal operating voltage) is effectively applied to the nonvolatile memory element 100 to change the resistance state to the low resistance state.

Specifically, in the above-described example, if the high resistance value is smaller than the predetermined threshold value, the control circuit 810 applies the first low resistance writing voltage VRL1 across a series circuit which includes the nonvolatile memory element 100 and a resistance element (the circuit resistance 202, not shown in FIG. 6), to apply a first voltage VL1 between the top electrode 107 and the bottom electrode 103 of the nonvolatile memory element 100. Moreover, if the high resistance value is equal to or greater than the predetermined threshold value, the control circuit 810 applies the second low resistance writing voltage VRL2 across the series circuit which includes the nonvolatile memory element 100 and the resistance element (the circuit resistance 202), to apply a second voltage VL2 smaller than the first voltage VL1 between the top electrode 107 and the bottom electrode 103 of the nonvolatile memory element 100.

Therefore, the method as described above in which the voltage applied to the series circuit is directly changed may not be used insofar as the voltage to be applied to the nonvolatile memory element 100 is changeable. That is, instead of changing the magnitude of the applied voltage, the magnitude of voltage effectively applied to the nonvolatile memory element 100 may be changed using the load resistance or the like.

Figure 9:
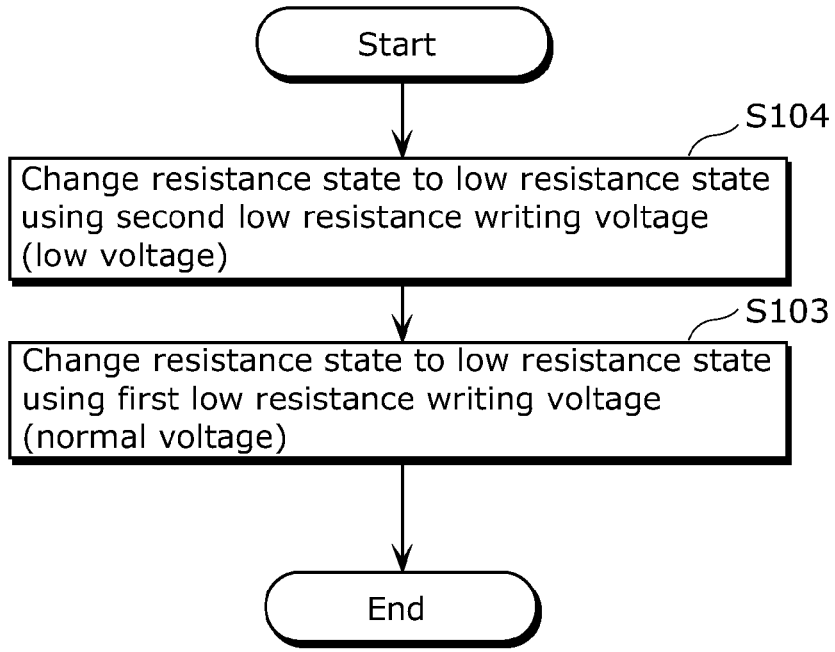
FIG. 9 is a flowchart of another example of the operation by the nonvolatile memory device according to the second embodiment of the present invention.

Moreover, as shown in FIG. 9, the measurement of the resistance value (S101) and the determination of the high resistance value (S102) upon resistance change to the low resistance state in the flowchart shown in FIG. 7 may be omitted. The following may be applied for all cases of the resistance change to the low resistance state: first, the resistance state of the nonvolatile memory element 100 is changed to the low resistance state, using the second low resistance writing voltage (S104), and thereafter the first low resistance writing voltage is further applied to the nonvolatile memory element 100 (S103).

Figure 10:
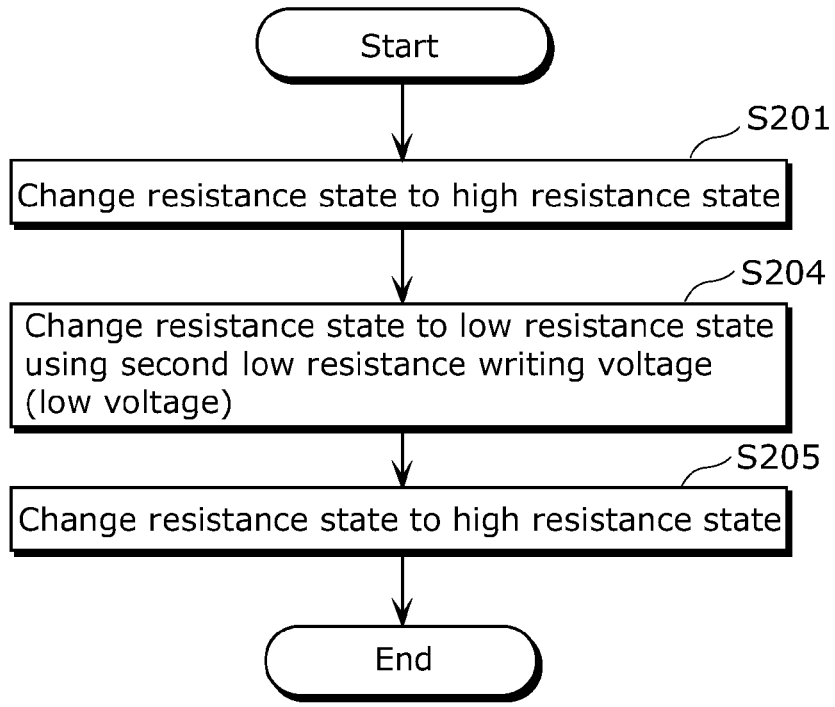
FIG. 10 is a flowchart of another example of the operation by the nonvolatile memory device according to the second embodiment of the present invention.

Furthermore, as shown in FIG. 10, the measurement of the resistance value (S202) and the determination of the high resistance value (S203) upon resistance change to the high resistance state in the flowchart shown in FIG. 8 may be omitted. The following may be applied to all cases of the resistance change to the high resistance state: first, the resistance state of the nonvolatile memory element 100 is changed to the high resistance state, using the high resistance writing voltage (S201), the resistance state of the nonvolatile memory element 100 is changed to the low resistance state, using the second low resistance writing voltage (S204), and the high resistance writing voltage is further applied to the nonvolatile memory element 100 (S205).

Employing such a structure allows reduction in time taken for a read process which requires longer time than a write process, and improvement of operation speed.

(Modification 1)

Figure 11:
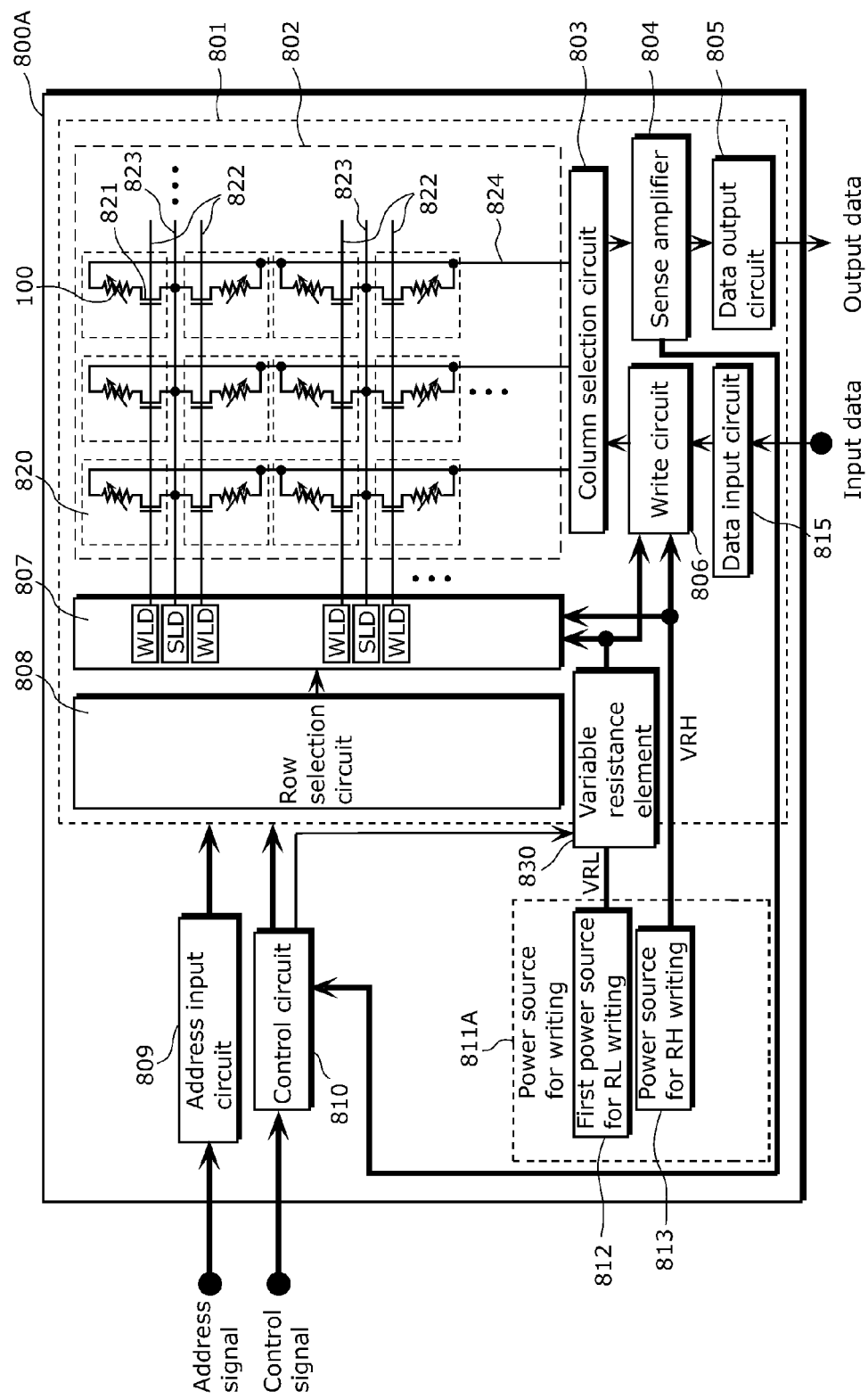
FIG. 11 is a diagram showing an example of a circuit structure of a modification 1 of the nonvolatile memory device according to the second embodiment of the present invention.

FIG. 11 is a block diagram showing a nonvolatile memory device 800A which changes a magnitude of a voltage effectively applied to the nonvolatile memory element 100, using load resistance or the like. The nonvolatile memory device 800A shown in FIG. 11 is different from the nonvolatile memory device 800 shown in FIG. 6 in that the structure of a power source 811A for writing is different from the structure of the power source 811 for writing. Moreover, the nonvolatile memory device 800A further includes a variable resistance element 830.

Specifically, the power source 811A for writing includes the first power source 812 for RL writing and the power source 813 for RH writing and does not include the second power source 814 for RL writing.

The variable resistance element 830 is substantially connected in series between the first power source 812 for RL writing and the memory cell 820.

Moreover, in the nonvolatile memory device 800A, if the high resistance value is smaller than the predetermined threshold value, the control circuit 810 sets a first resistance value to the resistance value of the variable resistance element 830 and applies the low resistance writing voltage VRL across a series circuit which includes the memory cell 820 and the variable resistance element 830, to apply the first low resistance writing voltage VRL1 across a series circuit which includes the nonvolatile memory element 100 and the circuit resistance 202 (not shown) and apply the first voltage VL1 between the top electrode 107 and the bottom electrode 103 of the nonvolatile memory element 100.

Moreover, if the high resistance value is equal to or greater than the predetermined threshold value, the control circuit 810 sets a second resistance value, which is higher than the first resistance value, to the resistance value of the variable resistance element 830 and applies the low resistance writing voltage VRL across a series circuit which includes the nonvolatile memory element 100 and the variable resistance element 830, to apply the second low resistance writing voltage VRL2 across a series circuit which includes the nonvolatile memory element 100 and the circuit resistance 202 (not shown) and apply a second voltage VL2 smaller than the first voltage VL1 between the top electrode 107 and the bottom electrode 103 of the nonvolatile memory element 100.

An example of the structure of the variable resistance element 830 will be described below.

Figure 12A:
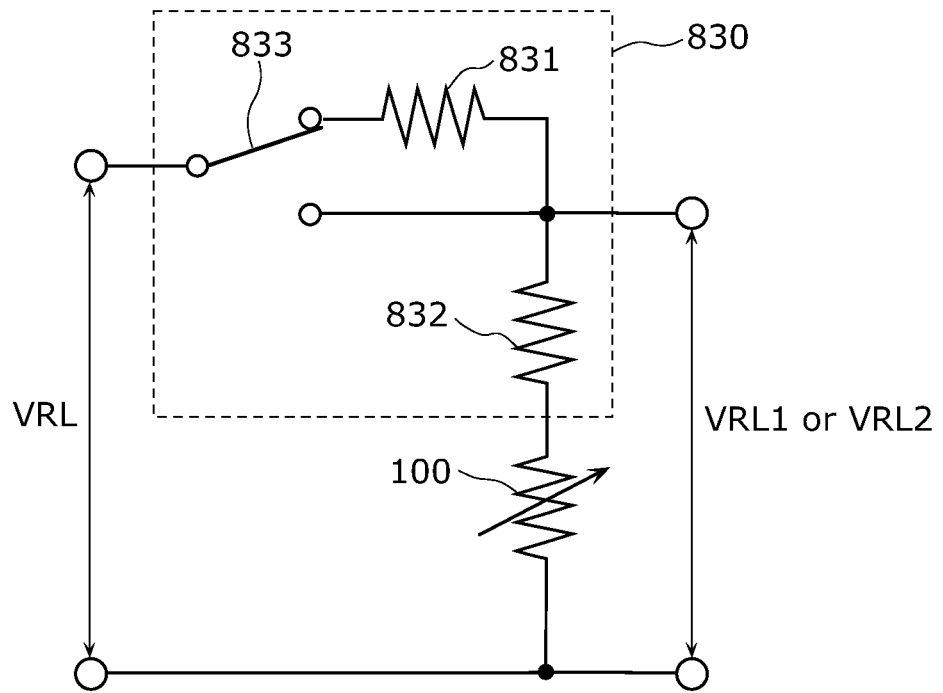
FIG. 12A is a circuit diagram of a variable resistance element according to the second embodiment of the present invention.

For example, FIG. 12A is a diagram showing an example of the variable resistance element 830. The variable resistance element 830 shown in FIG. 12A includes a first resistance element 831, a second resistance element 832, and a switch 833.

The first resistance element 831, the second resistance element 832, and the nonvolatile memory element 100 are connected in series in the stated order.

The switch 833 switches between: applying the low resistance writing voltage VRL across a first series circuit which includes the second resistance element 832 and the nonvolatile memory element 100: and applying the low resistance writing voltage VRL across a second series circuit which includes the first resistance element 831, the second resistance element 832, and the nonvolatile memory element 100.

In the structure, the control circuit 810 applies the low resistance writing voltage VRL across input terminals of the first series circuit to generate the first low resistance writing voltage VRL1 across output terminals of the first series circuit, and apply the first voltage VL1 between the top electrode 107 and the bottom electrode 103 of the nonvolatile memory element 100.

Moreover, the control circuit 810 applies the low resistance writing voltage VRL across input terminals of the second series circuit to generate the second low resistance writing voltage VRL2 across the output terminals of the second series circuit, and apply a second voltage VL2 smaller than the first voltage VL1 between the top electrode 107 and the bottom electrode 103 of the nonvolatile memory element 100. In other words, if the high resistance value is equal to or greater than the predetermined threshold value, the control circuit 810 interposes the first resistance element 831 in series in a normal path to reduce the voltage to be applied across the nonvolatile memory element 100.

As described above, the nonvolatile memory device 800 has the structure in which the first power source 812 for RL writing outputs the low resistance writing voltage VRL which is the same as the low resistance writing voltage under normal operation. However, if the high resistance value of the nonvolatile memory element 100 is equal to or greater than the predetermined threshold value, the nonvolatile memory device 800 can reduce an absolute value of the effective voltage, which is applied to the nonvolatile memory element 100, to be smaller than the low resistance writing voltage under normal operation, thereby preventing the held low resistance state.

It should be noted that while in FIG. 11, the variable resistance element 830 is a component independent of other circuits, a part of the variable resistance element 830 may be shared with other circuits. For example, a part or the whole of the second resistance element 832 may be the circuit resistance 202 described above (corresponding to one or more of the diode, transistor, and line resistance in actual use).

Figure 12B:
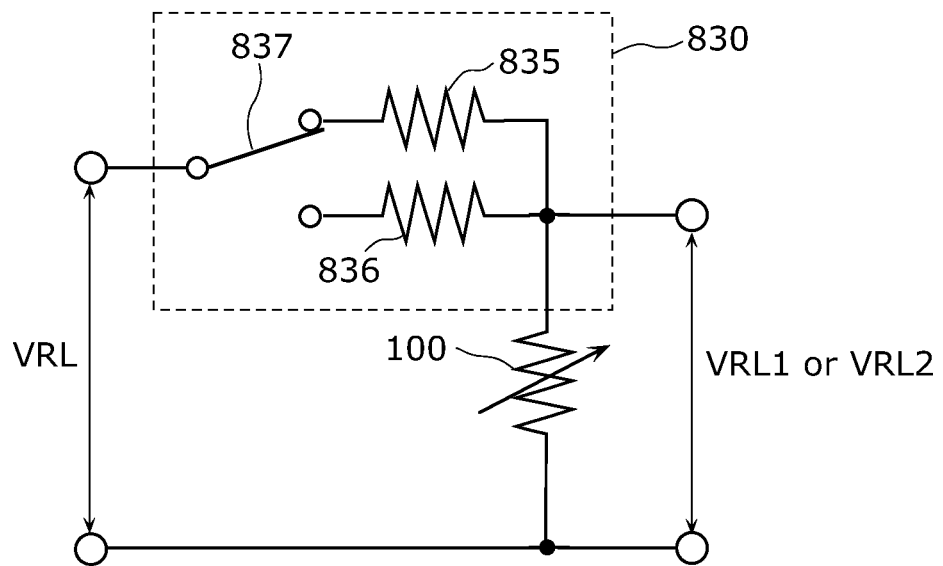
FIG. 12B is a circuit diagram of another example of the variable resistance element according to the second embodiment of the present invention.

FIG. 12B is a diagram showing another example of the variable resistance element 830. The variable resistance element 830 shown in FIG. 12B includes a first resistance element 835, a second resistance element 836, and a switch 837.

The first resistance element 835 and the second resistance element 836 are connected in parallel with each other. Moreover, a resistance value of the second resistance element 836 is higher than a resistance value of the first resistance element 835.

The switch 837 switches between: applying the low resistance writing voltage VRL across the input terminals of the first series circuit which includes the first resistance element 835 and the nonvolatile memory element 100: and applying the low resistance writing voltage VRL across the input terminals of the second series circuit which includes the second resistance element 836 and the nonvolatile memory element 100.

In the structure, the control circuit 810 applies the low resistance writing voltage VRL across the input terminals of the first series circuit to generate the first low resistance writing voltage VRL1 across the output terminals of the first series circuit and apply the first voltage VL1 between the top electrode 107 and the bottom electrode 103 of the nonvolatile memory element 100.

Moreover, the control circuit 810 applies the low resistance writing voltage VRL across the input terminals of the second series circuit to generate the second low resistance writing voltage VRL2 across the output terminals of the second series circuit and apply the second voltage VL2 smaller than the first voltage VL1 between the top electrode 107 and the bottom electrode 103 of the nonvolatile memory element 100.

As described above, the nonvolatile memory device 800 has the structure in which the first power source 812 for RL writing outputs the low resistance writing voltage VRL which is the same as the low resistance writing voltage under normal operation. However, the nonvolatile memory device 800 can reduce an absolute value of an effective voltage which is applied to the nonvolatile memory element 100, thereby preventing the held low resistance state.

It should be noted that a part or the whole of at least one of the first resistance element 835 and the second resistance element 836 may be the circuit resistance 202 described above (corresponding to one or more of the diode, transistor, and line resistance in actual use).

Figure 13:
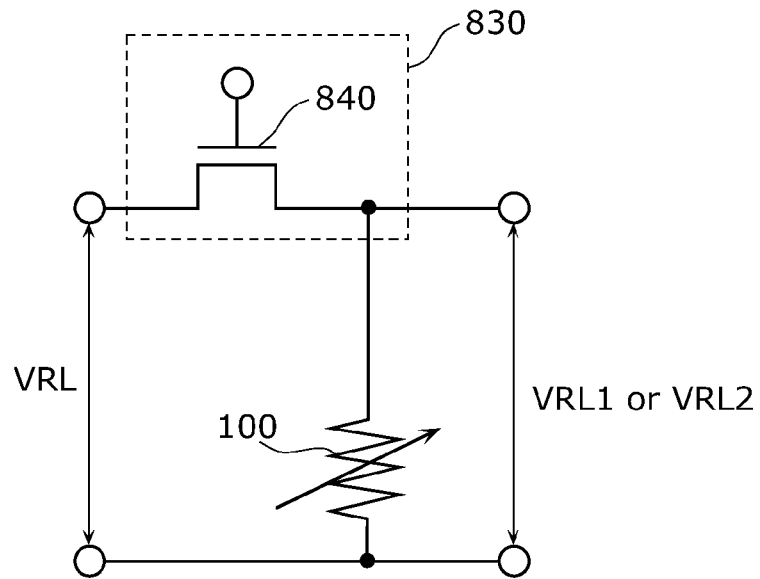
FIG. 13 is a circuit diagram of another example of the variable resistance element according to the second embodiment of the present invention.

FIG. 13 is a diagram showing another example of the variable resistance element 830. The variable resistance element 830 shown in FIG. 13 includes a transistor 840 for adjusting load resistance. The control circuit 810 changes a gate voltage of the transistor 840 to change the ON resistance of the transistor 840. By doing this, the control circuit 810 changes the resistance value of the variable resistance element 830. For example, the control circuit 810 applies the first voltage to a gate of the transistor 840 to set the first resistance value to the ON resistance of the transistor 840, and applies a second voltage lower than the first voltage to the gate of the transistor 840 to set the second resistance value which is higher than the first resistance value to the ON resistance of the transistor.

It should be noted that the transistor 840 may be the transistor 840 dedicated to reducing the voltage applied across the nonvolatile memory element 100, or may be a transistor originally provided between the first power source 812 for RL writing and the nonvolatile memory element 100. For example, a transistor included in the column selection circuit 803, the write circuit 806, or the row driver 807 may be used as the transistor 840, or the transistor 821 included in the memory cell 820 may be used as the transistor 840.

Moreover, the variable resistance element 830 may be a transistor which can adjust the gate voltage, or a combination circuit thereof. This is because changing the gate voltage of the transistor can change the ON resistance of the transistor.

(Modification 2)

In the above description, the example is given in which if the high resistance value exceeds the predetermined threshold value, the nonvolatile memory device according to the embodiment of the present invention applies to the nonvolatile memory element 100 a voltage an absolute value of which is smaller than that of a normal operating voltage, to change the resistance state to the low resistance state. The nonvolatile memory device according to the present embodiment has features that the low resistance writing is performed on a weaker write condition than the normal write condition if the high resistance value has exceeded the predetermined threshold value.

That is, if the high resistance value is smaller than the predetermined threshold value, the nonvolatile memory device performs the low resistance writing on a first write condition, and if the high resistance value is equal to or greater than the predetermined threshold value, the nonvolatile memory device performs the low resistance writing on a second write condition which is weaker than the first write condition.

Here, the weak write condition is a write condition on which change in resistance value due to the low resistance writing or the high resistance writing is small. In other words, the weak write condition is a write condition on which the resistance value after the resistance change to the low resistance state increases and the resistance value after the resistance change to the high resistance state reduces. Specifically, the weak write condition is a write condition on which the low resistance writing voltage is low as described above or a write condition on which the low resistance writing voltage is applied for a short period of time.

Hereinafter, description will be given in the case where if the high resistance value is equal to or greater than the predetermined threshold value, a voltage which is the same as a normal operating voltage is applied to the nonvolatile memory element 100 for a shorter time than under normal operation. Specifically, the nonvolatile memory device shortens the pulse widths or reduces the number of time the pulse is applied than under normal operation.

Figure 14:
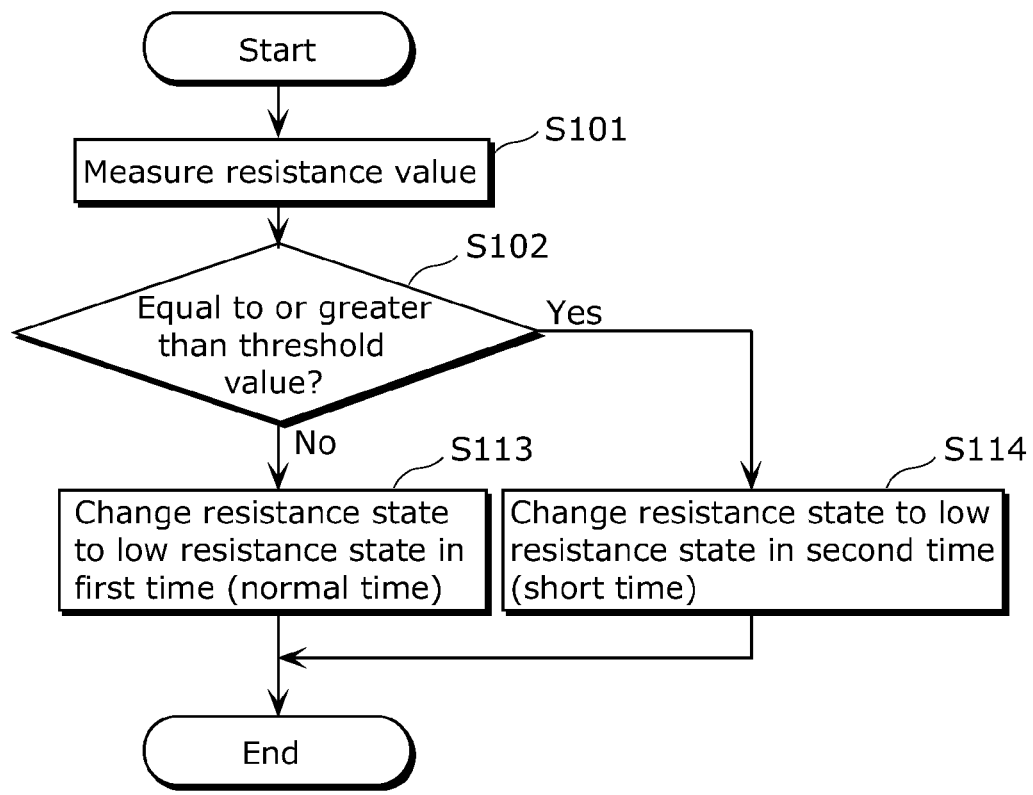
FIG. 14 is a flowchart of an operation by a nonvolatile memory device according to a modification 2 of the second embodiment of the present invention.

FIG. 14 is a flowchart illustrating a first method according to the modification 2. It should be noted that steps S101 and S102 are the same as those shown in FIG. 7 and the description thereof will be omitted.

If the resistance value measured at step S101 is less than the threshold value (No in S102), the control circuit 810 applies, for a first time, the low resistance writing voltage VRL to the nonvolatile memory element 100 to change the resistance state of the memory cell 820 to be written to the low resistance state (S113).

On the other hand, if the measured resistance value is equal to or greater than the threshold value (Yes in S102), the control circuit 810 applies, for a second time, the low resistance writing voltage VRL to the nonvolatile memory element 100 to change the resistance state of the memory cell 820 to be written to the low resistance state (S114). Here, the second time is shorter than the first time.

As described above, controlling time for which the low resistance writing voltage VRL is applied to the nonvolatile memory element 100 also inhibits the held low resistance state in the same manner as the case of controlling the voltage values.

Figure 15:
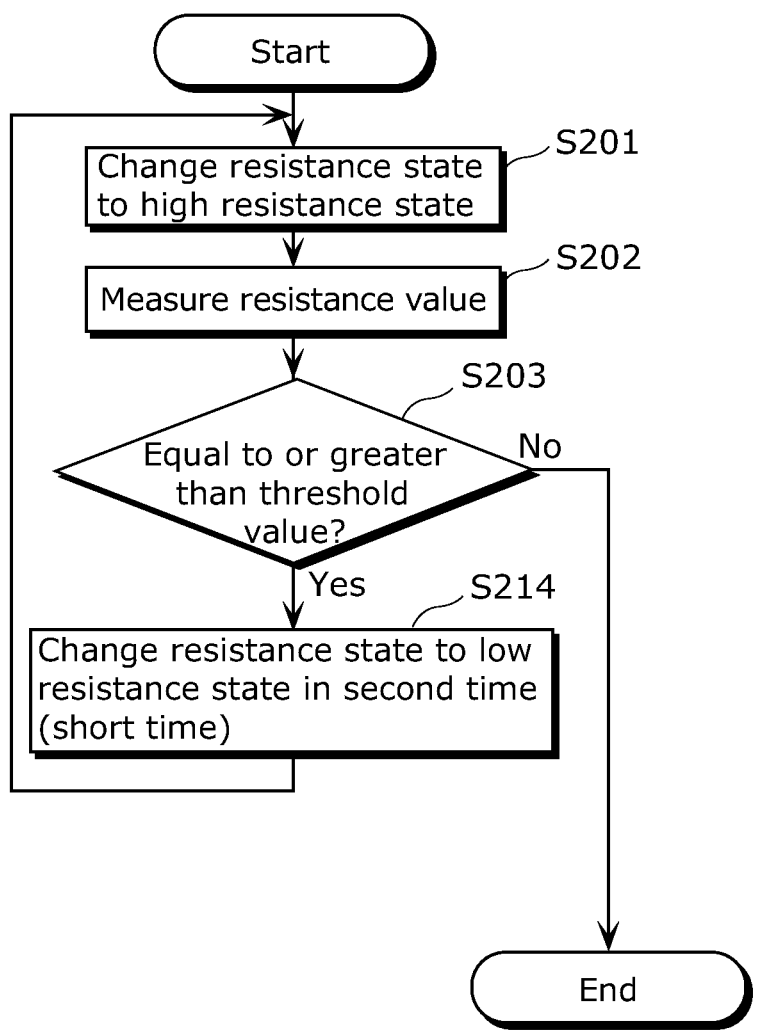
FIG. 15 is a flowchart of another example of the operation by the nonvolatile memory device according to the modification 2 of the second embodiment of the present invention.

FIG. 15 is a flowchart illustrating a second method according to the modification 2. It should be noted that steps S201 through S203 are the same as those shown in FIG. 8 and the description thereof will be omitted.

If the resistance value measured in step S202 is equal to or greater than the threshold value (Yes in S203), the control circuit 810 applies, for the second time, the low resistance writing voltage VRL to the nonvolatile memory element 100 to change the resistance state of the memory cell 820 to be written to the low resistance state (S214), and then performs again the processes from step S201.

That is, the control circuit 810 repeats the above-described processes until the resistance value is less than the threshold value after the resistance change to the high resistance state (No in S203).

It should be noted that the case of controlling the voltage values and the case of controlling the time for which the voltage is applied are described separately. However, the voltage values and the time for which the voltage is applied may both be controlled. For example, if the measured resistance value is less than the threshold value, the control circuit 810 applies, for the first time, the first low resistance writing voltage VRL1 to the nonvolatile memory element 100, and if the measured resistance value is equal to or greater than the threshold value, the control circuit 810 applies, for the second time, the second low resistance writing voltage VRL2 to the nonvolatile memory element 100. Here, a product of the second time and the second low resistance writing voltage VRL2 is smaller than a product of the first time and the first low resistance writing voltage VRL1.

(Modification 3)

In the above description, the example has been described in which the nonvolatile memory device according to the embodiment of the present invention switches, in accordance with the resistance value, between two voltages which are the first low resistance writing voltage VRL1 and the second low resistance writing voltage VRL2. However, the nonvolatile memory device may switch between three or more voltage values, in accordance with the resistance value.

Hereinafter, an operation when three voltage values are switched therebetween in accordance with the resistance value will be described.

Figure 16:
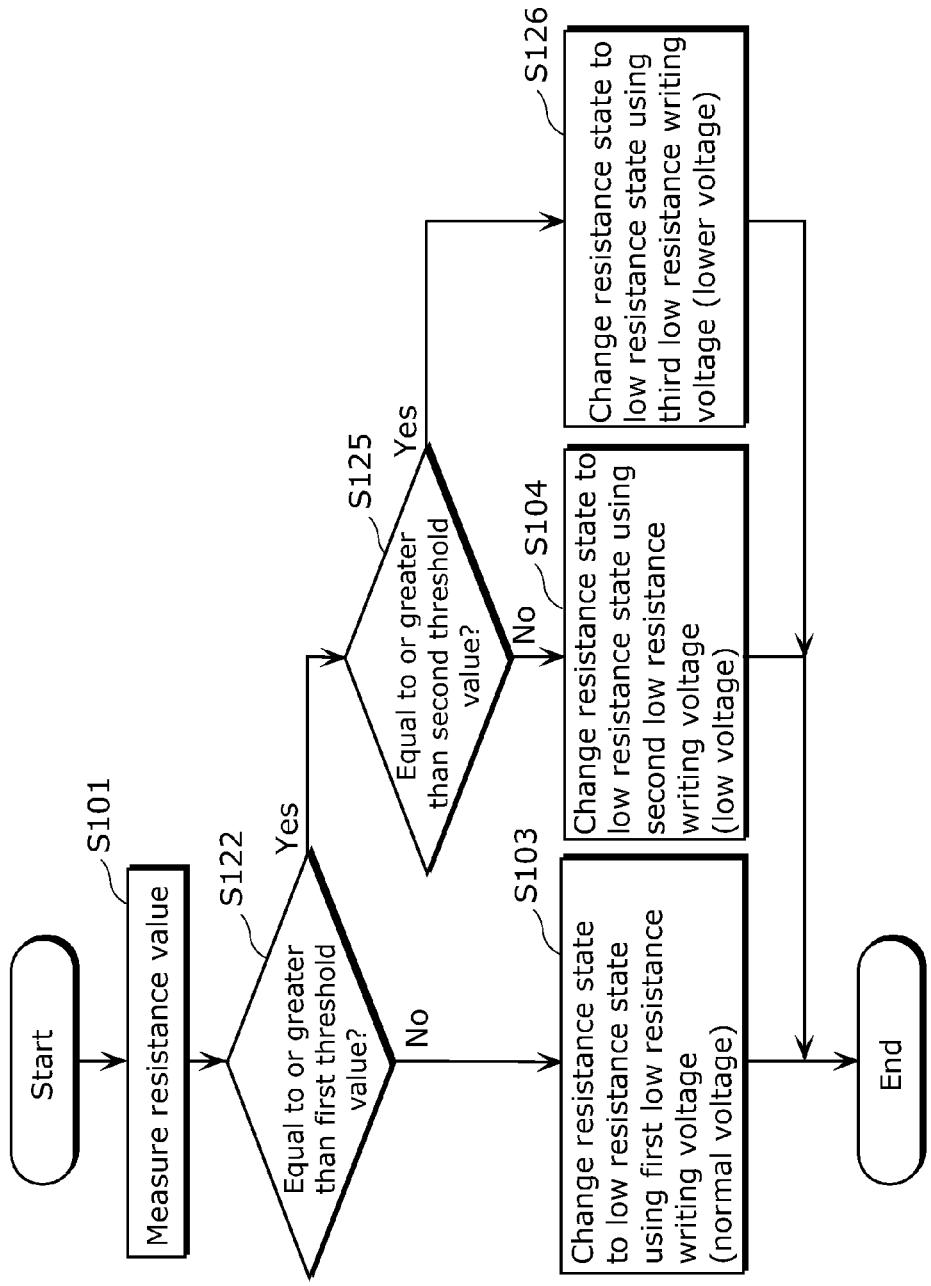
FIG. 16 is a flowchart of an operation by a nonvolatile memory device according to a modification 3 of the second embodiment of the present invention.

FIG. 16 is a flowchart illustrating a first method according to the modification 3.

As shown in FIG. 16, the control circuit 810 determines whether the resistance value measured in step S101 is equal to or greater than a first threshold value and whether the resistance value measured in step S101 is equal to or greater than a second threshold value (S122 and S125). Here, the second threshold value is greater than the first threshold value. That is, the control circuit 810 determines whether the resistance value is (1) less than the first threshold value, (2) equal to or greater than the first threshold value and less than the second threshold value, or (3) equal to or greater than the second threshold value.

If the measured resistance value is less than the first threshold value (No in S122), the control circuit 810 changes the resistance state of the memory cell 820 to be written to the low resistance state, using the first low resistance writing voltage (S103).

On the other hand, if the measured resistance value is equal to or greater than the first threshold value and less than the second threshold value (Yes in S122 and No in S125), the control circuit 810 changes the resistance state of the memory cell 820 to be written to the low resistance state, using the second low resistance writing voltage (S104).

Moreover, if the measured resistance value is equal to or greater than the second threshold value (Yes in S122 and Yes in S125), the control circuit 810 changes the resistance state of the memory cell 820 to be written to the low resistance state, using a third low resistance writing voltage (S126).

Here, the second low resistance writing voltage is smaller than the first low resistance writing voltage, and the third low resistance writing voltage is smaller than the second low resistance writing voltage.

Thus, the nonvolatile memory device according to the modification 3 can prevent the held low resistance state and reduce variation in resistance value of the nonvolatile memory element 100 by controlling, in multiple steps, the voltage value of the low resistance writing voltage, in accordance with the resistance value.

Figure 17:
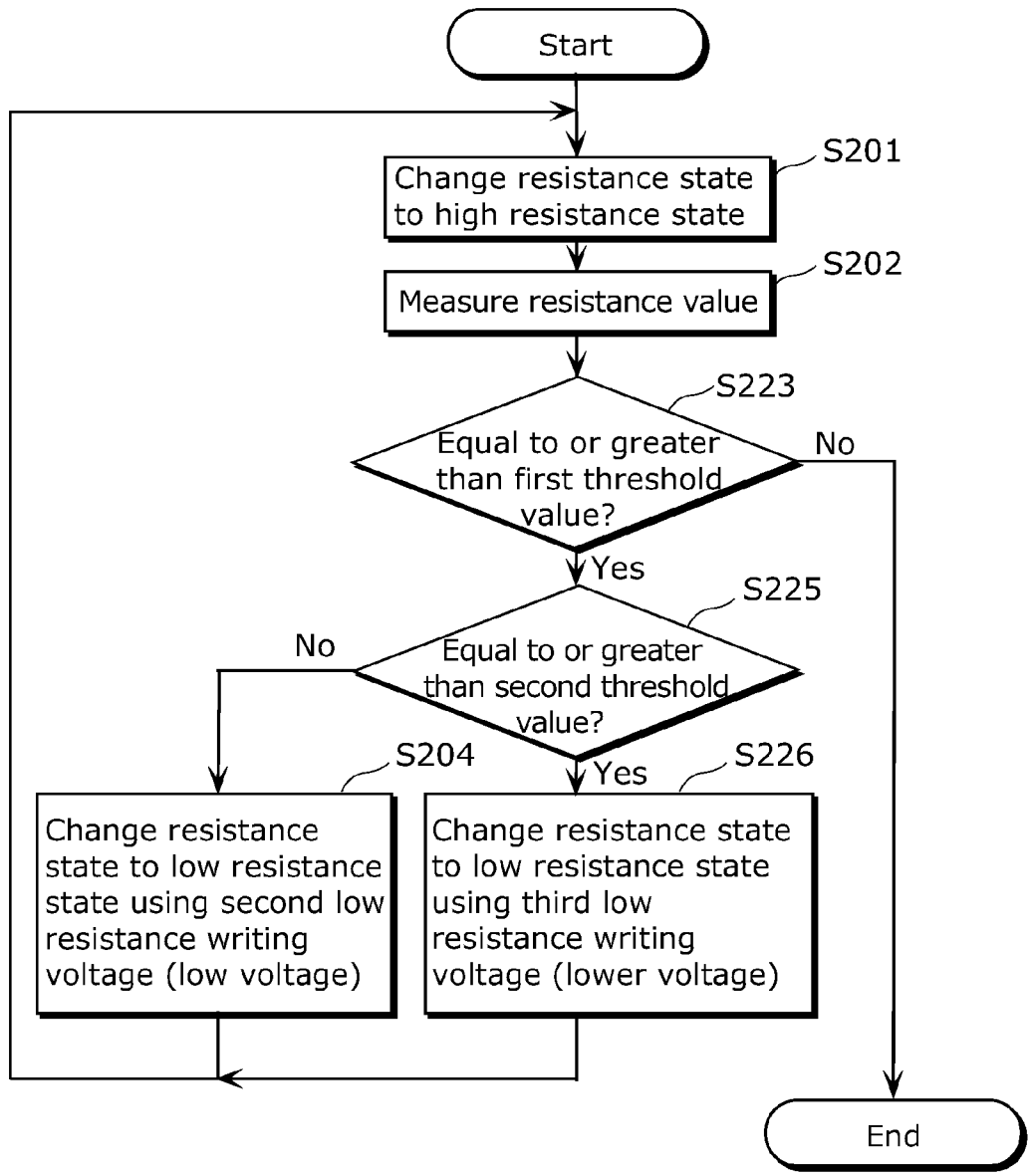
FIG. 17 is a flowchart of another example of the operation by the nonvolatile memory device according to the modification 3 of the second embodiment of the present invention.

FIG. 17 is a flowchart illustrating a second method according to the modification 3.

As shown in FIG. 17, the control circuit 810 determines whether the resistance value measured in step S202 is equal to or greater than the first threshold value and whether the resistance value measured in step S202 is equal to or greater than the second threshold value (S223 and S225).

If the measured resistance value is equal to or greater than the first threshold value and less than the second threshold value (Yes in S223 and No in S225), the control circuit 810 changes the resistance state of the memory cell 820 to be written to the low resistance state, using the second low resistance writing voltage (S204), and then performs again the processes from step S201.

On the other hand, if the measured resistance value is equal to or greater than the first threshold value and equal to or greater than the second threshold value (Yes in S223 and Yes in S225), the control circuit 810 changes the resistance state of the memory cell 820 to be written to the low resistance state, using the third low resistance writing voltage (S226), and then performs again the processes from step S201.

That is, the control circuit 810 repeats the above-described processes until the resistance value is less than the first threshold value after the resistance change to the high resistance state (No in S223).

(Modification 4)

In the above description, the example of preventing the held low resistance state has been described. However, the present invention is also applicable to preventing the held high resistance state. In a modification 4, the structure for preventing the held high resistance state will be described.

Figure 18:
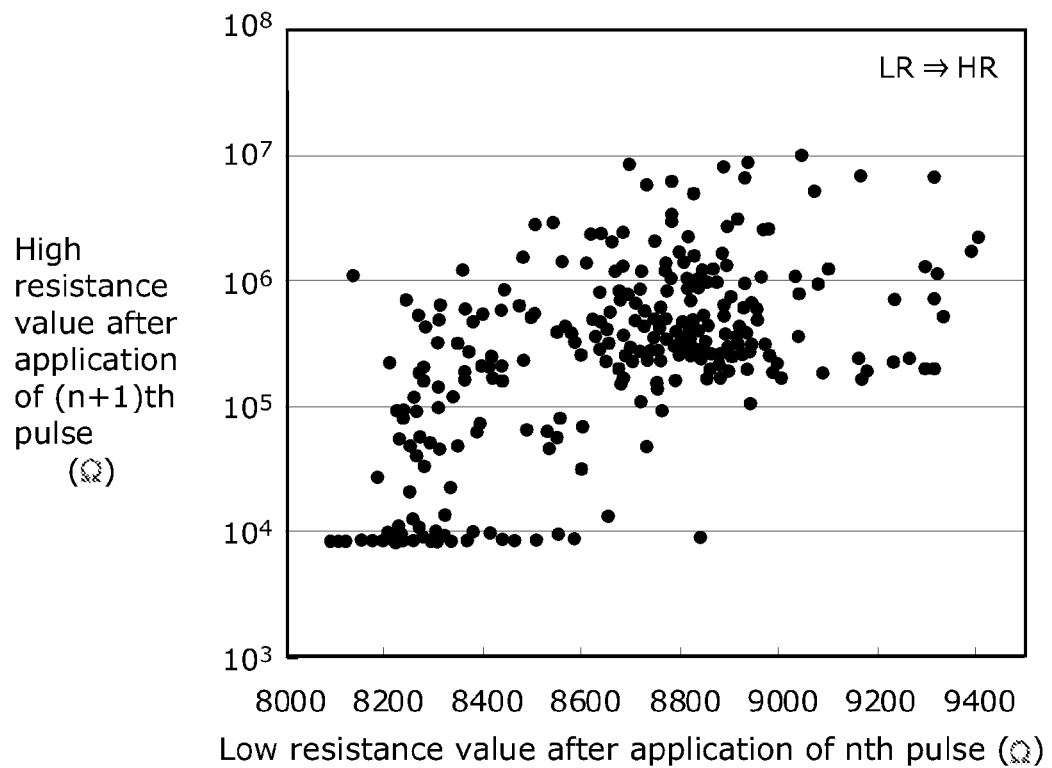
FIG. 18 is a diagram showing correlation between resistance values of a nonvolatile memory element according to a modification 4 of the second embodiment of the present invention in the low resistance state and the high resistance state.
Figure 19:
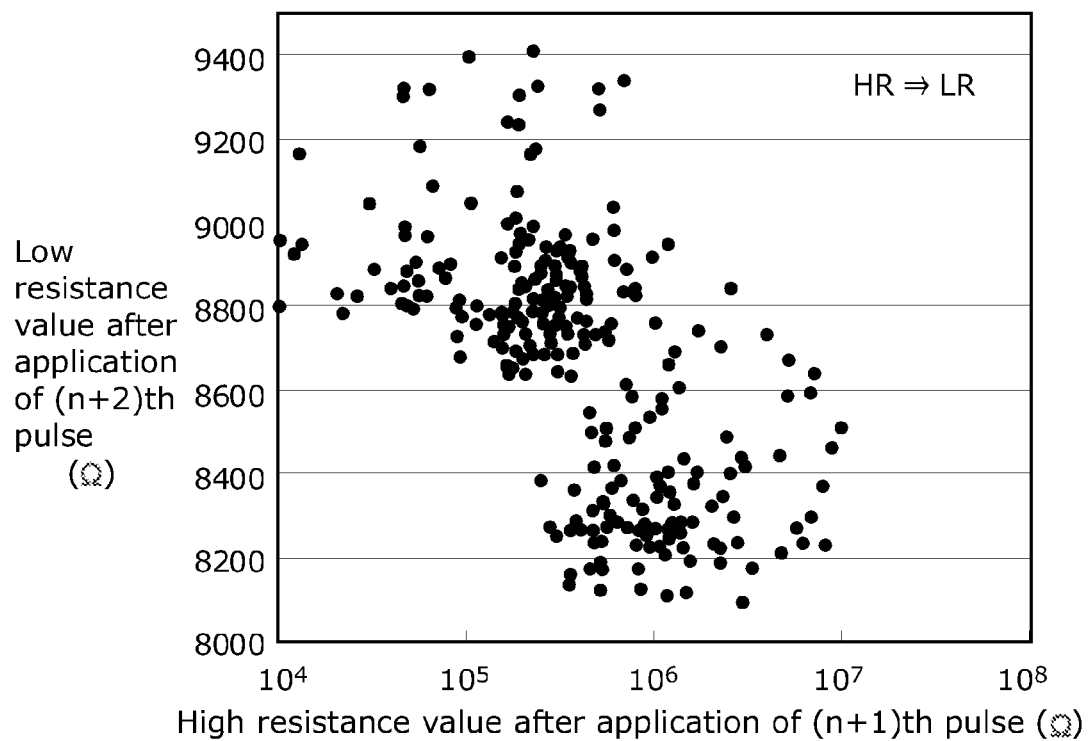
FIG. 19 is a diagram showing correlation between the resistance values of the nonvolatile memory element according to the modification 4 of the second embodiment of the present invention in the high resistance state and the low resistance state.

FIG. 18 is a diagram showing relationship between the low resistance value after application of nth pulse and the high resistance value after application of n+1th pulse. FIG. 19 is a diagram showing relationship between the high resistance value after the application of n+1th pulse and the low resistance value after application of n+2th pulse.

As shown in FIG. 18, if the immediately preceding low resistance value is low, the high resistance value after the resistance change to the high resistance state decreases, and if the immediately preceding low resistance value is high, the high resistance value after the resistance change to the high resistance state increases. This is due to the fact, as with the case of resistance change to the low resistance value described above, that the lower the resistance value of the nonvolatile memory element 100 is, the greater the substantial voltage, which is applied to the nonvolatile memory element in writing, decreases.

Figure 20:
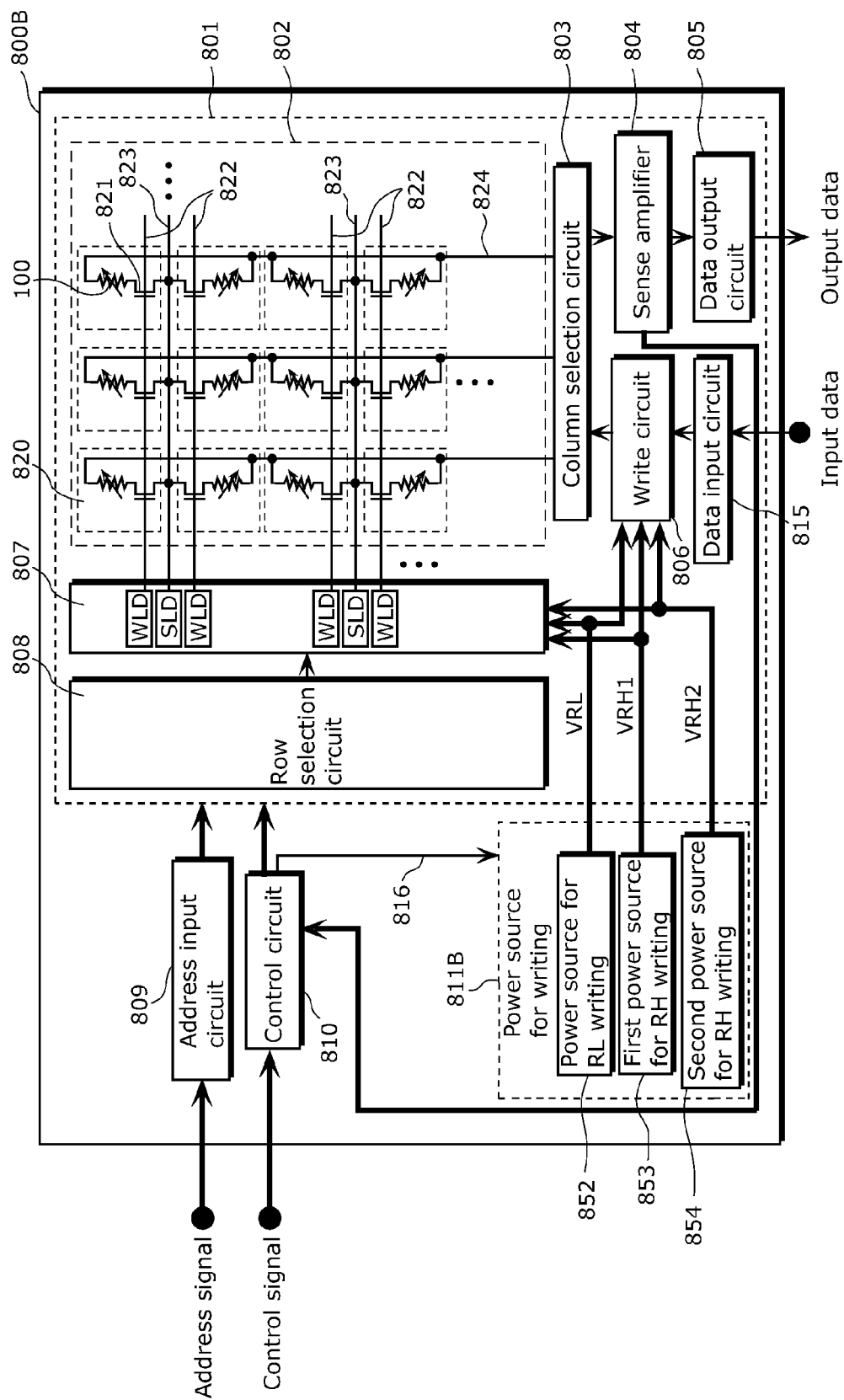
FIG. 20 is a diagram showing an example of a circuit structure of the nonvolatile memory device according to the modification 4 of the second embodiment of the present invention.

FIG. 20 is a block diagram showing a structure of a nonvolatile memory device 800B according to the modification 4.

The nonvolatile memory device 800B shown in FIG. 20 is different from the nonvolatile memory device 800 shown in FIG. 6 in that a power source 811B for writing has a different structure from the power source 811 for writing.

Specifically, the power source 811B for writing includes a power source for low resistance writing (a power source 852 for RL writing), a first power source 853 for high resistance writing (a first power source for RH writing), and a second power source 854 for high resistance writing (a second power source for RH writing).

The power source 852 for RL writing generates a low resistance writing voltage VRL which is used in low resistance writing.

The first power source 853 for RH writing generates a first high resistance writing voltage VRH1 which is used in normal high resistance writing.

The second power source 854 for RH writing generates a second high resistance writing voltage VRH2 which is used for the resistance change to the high resistance state if the low resistance value of the nonvolatile memory element 100 has exceeded a predetermined threshold value. Here, an absolute value of the second high resistance writing voltage VRH2 is smaller than an absolute value of the first high resistance writing voltage VRH1.

Moreover, in the nonvolatile memory device 800B, if the low resistance value is smaller than the threshold value, the control circuit 810 performs the high resistance writing, using the first high resistance writing voltage VRH1. Moreover, if the low resistance value is equal to or greater than the threshold value, the control circuit 810 performs the high resistance writing, using the second high resistance writing voltage VRH2.

Using the above structure, the nonvolatile memory device 800B according to the modification 4 can prevent the held high resistance state. Moreover, the nonvolatile memory device 800B can inhibit the high resistance value from increasing even in the case where the held high resistance state does not occur. As described above, the increase of the high resistance value raises the possibility that the held low resistance state can occur in the subsequent resistance change to the low resistance state. That is, the nonvolatile memory device 800B prevents the high resistance value from increasing, thereby inhibiting the occurrence of the held low resistance state as well. For the same reasons, the nonvolatile memory devices 800 and 800A described above inhibit not only the held low resistance state but also the held high resistance state.

Moreover, even in the case where such the held high resistance state or the held low resistance state does not occur, the nonvolatile memory device according to the present embodiment at least has effects in reducing variation in resistance value of the nonvolatile memory element 100.

Hereinafter, an operation of the nonvolatile memory device 800B according to the modification 4 will be described.

Figure 21:
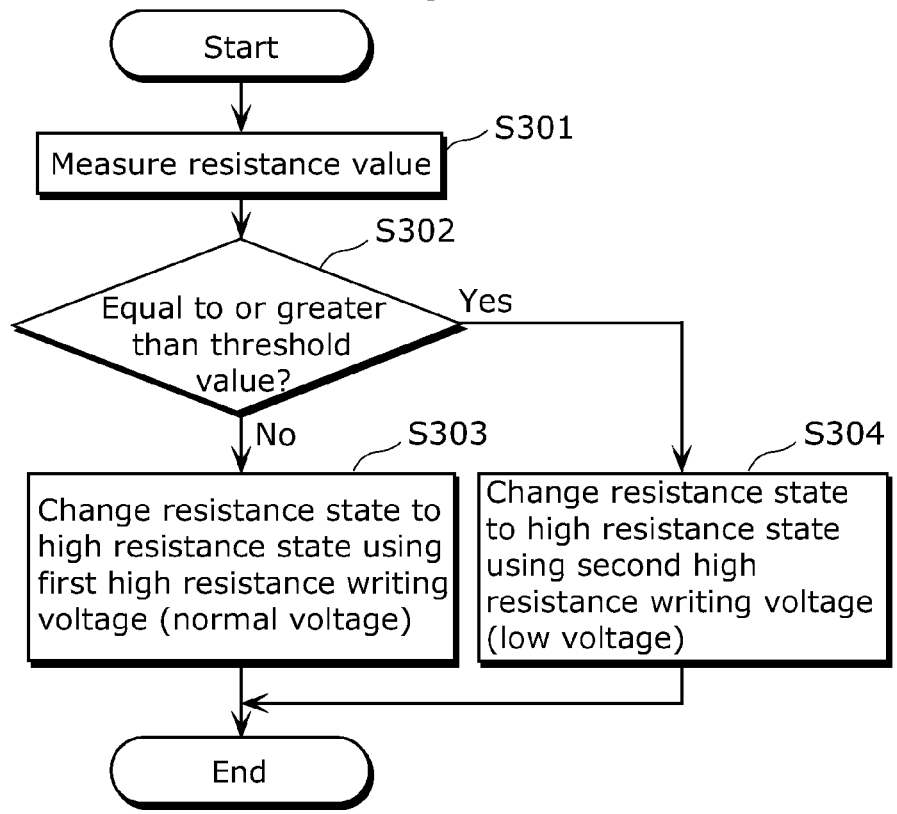
FIG. 21 is a flowchart of an operation by the nonvolatile memory device according to the modification 4 of the second embodiment of the present invention.

FIG. 21 is a flowchart illustrating a first method according to the modification 4.

As shown in FIG. 21, upon changing the resistance state of the memory cell 820 to the high resistance state, the control circuit 810 first measures the resistance value of the memory cell 820 to be written in the low resistance state (S301) and determines whether the measured resistance value is equal to or greater than a predetermined threshold value (S302).

If the measured resistance value is less than the threshold value (No in S302), the control circuit 810 changes the resistance state of the memory cell 820 to be written to the high resistance state, using the first high resistance writing voltage VRH1 (S303).

On the other hand, if the measured resistance value is equal to or greater than the threshold value (Yes in S302), the control circuit 810 changes the resistance state of the memory cell 820 to be written to the low resistance state, using the second high resistance writing voltage VRH2 (S304).

Figure 22:
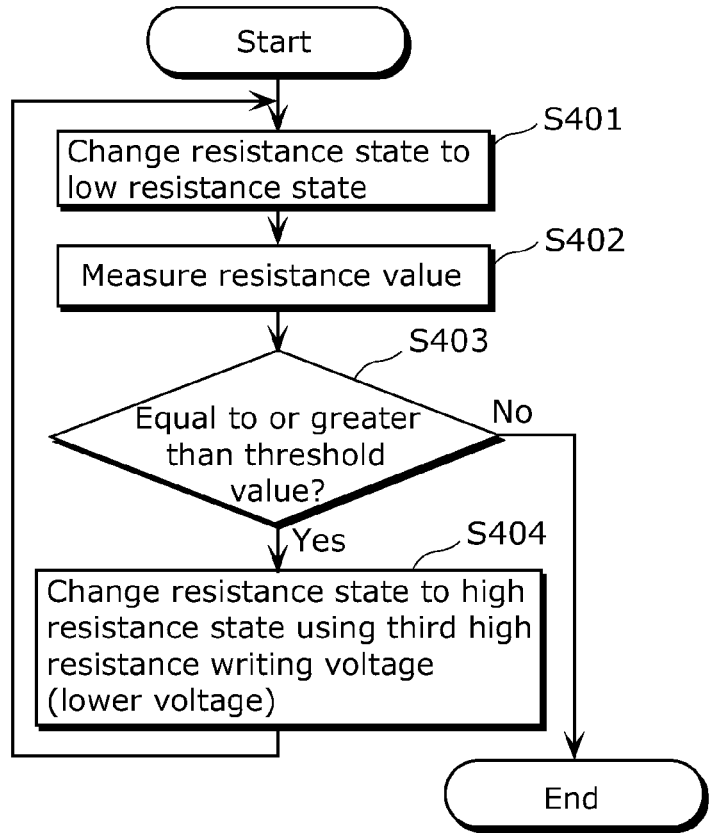
FIG. 22 is a flowchart of another example of the operation by the nonvolatile memory device according to the modification 4 of the second embodiment of the present invention.

FIG. 22 is a flowchart showing a second method according to the modification 4.

As shown in FIG. 22, upon changing the resistance state of the memory cell 820 to the low resistance state, the control circuit 810 first changes the resistance state of the memory cell 820 to be written to the low resistance state, using the low resistance writing voltage VRL (S401).

Next, the control circuit 810 measures the resistance value of the memory cell 820 to be written to the low resistance state (S402) and determines whether the measured resistance value is equal to or greater than the predetermined threshold value (S403).

If the measured resistance value is equal to or greater than the threshold value (Yes in S403), the control circuit 810 changes the resistance state of the memory cell 820 to be written to the high resistance state, using the second high resistance writing voltage VRH2 (S404), and then performs again the processes from step S401. That is, the control circuit 810 repeats steps S401 through S404 until the resistance value is less than the threshold value after the resistance change to the low resistance state (No in S403).

It should be noted that, here, the example of switching the high resistance writing voltage is described. However, as with the modifications described above, the nonvolatile memory device 800B may change the resistance value of the variable resistance element connected in series with the nonvolatile memory element 100 to change the value of voltage applied to the nonvolatile memory element 100. Moreover, the nonvolatile memory device 800B may change the time for which the high resistance writing voltage is applied.

Moreover, both the process in which the high resistance writing voltage is switched in accordance with the low resistance value, which is described in the modification 4, and the process in which the low resistance writing voltage is switched in accordance with the high resistance value, which is described up to the modification 3, have common technical features that if the resistance value is smaller than the predetermined threshold value, the first voltage which is a normal voltage is used, and if the resistance value is equal to or greater than the threshold value, the second voltage smaller than the first voltage is used.

That is, the nonvolatile memory device according to the present embodiment determines whether the resistance value of the variable resistance layer in one of the high resistance state and the low resistance state is equal to or greater than the predetermined threshold value, and if the resistance value is smaller than the threshold value, the nonvolatile memory device changes the variable resistance layer in one of the high resistance state and the low resistance state to the other on the first write condition, and if the resistance value of the variable resistance layer is equal to or greater than the threshold value, the nonvolatile memory device changes the variable resistance layer in one state to the other state on the second write condition weaker than the first write condition.

It should be noted that the nonvolatile memory device according to the present embodiment may perform both the control for changing the write condition, in accordance with the high resistance value, and the control for changing the write condition, in accordance with the low resistance value.

As described above, while the nonvolatile memory device according to the embodiments of the present invention has been described, the present invention is not limited to the embodiments.

For example, in the example of the structure described above, the source lines are disposed in parallel with the word lines. However, the source lines may be disposed in parallel with the bit lines.

Moreover, the processing components included in the nonvolatile memory device according to the above embodiment are each typically implemented as an LSI which is an integrated circuit. These processing components may separately be mounted on one chip, or a part or the whole of the processing components may be mounted on one chip.

Moreover, the integrated circuit is not limited to the LSI and may be implemented as a dedicated circuit or a general-purpose processor. An FPGA (Field Programmable Gate Array) which is programmable after manufacturing the LSI, or a reconfigurable processor in which connection or settings of circuit cells in LSI is reconfigurable, may be used.

Moreover, part of the functionality of the nonvolatile memory device according to the embodiment of the present invention may be implemented by a processor such as CPU executing a program.

Furthermore, the present invention may be the above-described program, or a storage medium having stored therein the program. Moreover, the program can, of course, be distributed via transmission medium such as the Internet.

Moreover, while corners and sides of each component are depicted in a linear manner in the cross-sectional view and the like, for manufacturing reasons, components having rounded corners and rounded lines are also included in the present invention.

Moreover, at least part of the functionality of the nonvolatile memory device according to the embodiment and part of the functionality of each modification may be combined.

Moreover, numerals used in the above are merely illustrative for specifically describing the present invention and the present invention is not limited thereto. The materials of the components described above are merely illustrative for specifically describing the present invention and the present invention is not limited thereto.

Moreover, the order in which steps included in the method for programming the nonvolatile memory element is merely illustrative for specifically describing the present invention and may be different order. Moreover, part of steps described above may be executed concurrently (in parallel) with other steps.

Furthermore, various modifications to the present embodiments that may be conceived by those skilled in the art are included in the present invention, without departing from the spirit of the present invention.

INDUSTRIAL APPLICABILITY

The present invention is applicable to methods for operating nonvolatile memory devices and nonvolatile memory elements. Moreover, the present invention is applicable to various electronic devices such as digital consumer electronics, memory cards, mobile phones, and personal computers.

REFERENCE SIGNS LIST

100 Nonvolatile memory element
101 Substrate
102 Oxide layer
103 Bottom electrode
104 First oxygen-deficient Ta-oxide layer
105 Second oxygen-deficient Ta-oxide layer
106 Variable resistance layer
107 Top electrode
202 Circuit resistance
203, 204 Terminal
800, 800A, 800B Nonvolatile memory device
801 Memory main portion
802 Memory array
803 Column selection circuit
804 Sense amplifier
805 Data output circuit
806 Write circuit
807 Row driver
808 Row selection circuit
809 Address input circuit
810 Control circuit
811, 811A, 811B Power source for writing
812 First power source for RL writing
813 Power source for RH writing
814 Second power source for RL writing
815 Data input circuit
816 Voltage setting signal
820 Memory cell
821 Transistor
822 Word line
823 Source line
824 Bit line
830 Variable resistance element
831, 835 First resistance element
832, 836 Second resistance element
833, 837 Switch
840 Transistor
852 Power source for RL writing
853 First power source for RH writing
854 Second power source for RH writing
VL1 First voltage
VL2 Second voltage
VRL Low resistance writing voltage
VRL1 First low resistance writing voltage
VRL2 Second low resistance writing voltage
VRH High resistance writing voltage
VRH1 First high resistance writing voltage
VRH2 Second high resistance writing voltage

The invention claimed is:

1. A nonvolatile memory device comprising:
a nonvolatile memory element including: a first electrode; a second electrode; and
a variable resistance layer having a resistance state which reversibly changes between a high resistance state and a low resistance state in which a resistance value of said variable resistance layer is smaller than the resistance value in the high resistance state, based on electrical signals having different polarities which are given between said first electrode and said second electrode, said variable resistance layer being interposed between said first electrode and said second electrode; and a control circuit for applying a voltage having a first polarity between said first electrode and said second electrode to change a resistance state of said variable resistance layer from the low resistance state to the high resistance state, and applying a voltage having a second polarity opposite to the first polarity between said first electrode and said second electrode to change the resistance state of said variable resistance layer from the high resistance state to the low resistance state,
wherein said control circuit:
determines whether the resistance value of said variable resistance layer in the high resistance state is equal to or greater than a first threshold value;
applies a first voltage having the second polarity between said first electrode and said second electrode if the resistance value of said variable resistance layer in the high resistance state is smaller than the first threshold value, to change the resistance state of said variable resistance layer from the high resistance state to the low resistance state; and
applies a second voltage, which has the second polarity and an absolute value of which is smaller than an absolute value of the first voltage, between said first electrode and said second electrode if the resistance value of said variable resistance layer in the high resistance state is equal to or greater than the first threshold value, to change the resistance state of said variable resistance layer from the high resistance state to the low resistance state.

2. The nonvolatile memory device according to claim 1, further comprising:
an electrical element which has a resistance component and is connected in series with said nonvolatile memory element;
a first power source for low resistance writing for generating a first low resistance writing voltage which has the second polarity; and
a second power source for low resistance writing for generating a second low resistance writing voltage which has the second polarity and an absolute value of which is smaller than an absolute value of the first low resistance writing voltage,
wherein said control circuit:
applies the first low resistance writing voltage across a series circuit which includes said nonvolatile memory element and said electrical element if the resistance value of said variable resistance layer in the high resistance state is smaller than the first threshold value, to apply the first voltage between said first electrode and said second electrode; and
applies the second low resistance writing voltage across the series circuit if the resistance value of said variable resistance layer in the high resistance state is equal to or greater than the first threshold value, to apply the second voltage between said first electrode and said second electrode.

3. The nonvolatile memory device according to claim 1, further comprising:
a variable resistance element connected in series with said nonvolatile memory element; and
a power source for low resistance writing for generating the low resistance writing voltage which has the second polarity,
wherein said control circuit:
sets a first resistance value to said variable resistance element and applies the low resistance writing voltage across a series circuit which includes said nonvolatile memory element and said variable resistance element if the resistance value of said variable resistance layer in the high resistance state is smaller than the first threshold value, to apply the first voltage between said first electrode and said second electrode; and sets a second resistance value greater than the first resistance value to said variable resistance element and applies the low resistance writing voltage across the series circuit if the resistance value of said variable resistance layer in the high resistance state is equal to or greater than the first threshold value, to apply the second voltage between said first electrode and said second electrode.

4. The nonvolatile memory device according to claim 3, wherein said variable resistance element includes a first resistance element and a second resistance element, said first resistance element, said second resistance element, and said nonvolatile memory element are connected in series in the stated order, and said control circuit:

applies the low resistance writing voltage across a first series circuit which includes said second resistance element and said nonvolatile memory element if the resistance value of said variable resistance layer in the high resistance state is smaller than the first threshold value, to apply the first voltage between said first electrode and said second electrode; and applies the low resistance writing voltage across a second series circuit which includes said first resistance element, said second resistance element, and said nonvolatile memory element if the resistance value of said variable resistance layer in the high resistance state is equal to or greater than the first threshold value, to apply the second voltage between said first electrode and said second electrode.

5. The nonvolatile memory device according to claim 3, wherein said variable resistance element includes a first resistance element and a second resistance element which are connected in parallel to each other, a resistance value of said second resistance element is greater than a resistance value of said first resistance element, and said control circuit:

applies the low resistance writing voltage across a first series circuit which includes said nonvolatile memory element and said first resistance element if the resistance value of said variable resistance layer in the high resistance state is smaller than the first threshold value, to apply the first voltage between said first electrode and said second electrode; and applies the low resistance writing voltage across a second series circuit which includes said nonvolatile memory element and said second resistance element if the resistance value of said variable resistance layer in the high resistance state is equal to or greater than the first threshold value, to apply the second voltage between said first electrode and said second electrode.

6. The nonvolatile memory device according to claim 3, wherein said variable resistance element includes a transistor, and said control circuit changes an ON resistance of said transistor by changing a voltage applied to a gate of said transistor, to change a resistance value of said variable resistance element.

7. The nonvolatile memory device according to claim 1, wherein, to change the resistance state of said variable resistance layer from the high resistance state to the low resistance state, said control circuit:

determines whether the resistance value of said variable resistance layer in the high resistance state is equal to or greater than the first threshold value;

applies the first voltage between said first electrode and said second electrode if the resistance value of said variable resistance layer in the high resistance state is smaller than the first threshold value, to change the resistance state of said variable resistance layer from the high resistance state to the low resistance state; and applies the second voltage, the absolute value of which is smaller than the absolute value of the first voltage, between said first electrode and said second electrode if the resistance value of said variable resistance layer in the high resistance state is equal to or greater than the first threshold value, to change the resistance state of said variable resistance layer from the high resistance state to the low resistance state.

8. The nonvolatile memory device according to claim 1, wherein, to change the resistance state of said variable resistance layer from the low resistance state to the high resistance state, said control circuit repeats, until the resistance value of said variable resistance layer in the high resistance state is smaller than the first threshold value:

changing the resistance state of said variable resistance layer from the low resistance state to the high resistance state;

determining whether the resistance value of said variable resistance layer in the high resistance state is equal to or greater than the first threshold value; and applying the second voltage, the absolute value of which is smaller than the absolute value of the first voltage, between said first electrode and said second electrode if the resistance value of said variable resistance layer in the high resistance state is equal to or greater than the first threshold value, to change the resistance state of said variable resistance layer from the high resistance state to the low resistance state.

9. The nonvolatile memory device according to claim 1, wherein said variable resistance layer includes at least two oxide layers comprising a transition metal and having different oxygen concentrations, and among the at least two oxide layers, an oxide layer that has a highest oxygen concentration is in contact with said first electrode or said second electrode.

10. The nonvolatile memory device according to claim 9, wherein the transition metal is tantalum.

11. The nonvolatile memory device according to claim 1, wherein if the resistance value of said variable resistance layer in the high resistance state is equal to or greater than the first threshold value and the resistance state of said nonvolatile memory element is changed from the high resistance state to the low resistance state, said nonvolatile memory element causes a held low resistance state to occur.

12. The nonvolatile memory device according to claim 1, wherein said control circuit further:

determines whether the resistance value of said variable resistance layer in the high resistance state is equal to or greater than a second threshold value greater than the first threshold value; and applies a third voltage, an absolute value of which is smaller than the absolute value of the second voltage and which has the second polarity, between said first electrode and said second electrode if the resistance value of said variable resistance layer in the high resistance state is equal to or greater than the second threshold value, to change the resistance state of said variable resistance layer from the high resistance state to the low resistance state.

13. A nonvolatile memory device comprising:
a nonvolatile memory element including: a first electrode; a second electrode; and a variable resistance layer having a resistance state which reversibly changes between a high resistance state and a low resistance state in which a resistance value of said variable resistance layer is smaller than the resistance value in the high resistance state, based on electrical signals having different polarities which are given between said first electrode and said second electrode, said variable resistance layer being interposed between said first electrode and said second electrode; and
a control circuit for applying a voltage having a first polarity between said first electrode and said second electrode to change a resistance state of said variable resistance layer from the low resistance state to the high resistance state, and applying a voltage having a second polarity opposite to the first polarity between said first electrode and said second electrode to change the resistance state of said variable resistance layer from the high resistance state to the low resistance state,
wherein said control circuit:
determines whether the resistance value of said variable resistance layer in one state between the high resistance state and the low resistance state is equal to or greater than a predetermined threshold value;
changes the resistance state of said variable resistance layer from the one state between the high resistance state and the low resistance state to the other state on a first write condition if the resistance value of said variable resistance layer is smaller than the threshold value; and
changes the resistance state of said variable resistance layer from the one state to the other state on a second write condition weaker than the first write condition if the resistance value of said variable resistance layer is equal to or greater than the threshold value.

14. The nonvolatile memory device according to claim 13, wherein said control circuit:
changes the resistance state of said variable resistance layer from the one state to the other state on the first write condition, in which a first voltage is applied between said first electrode and said second electrode, if the resistance value of said variable resistance layer is smaller than the threshold value; and
changes the resistance state of said variable resistance layer from the one state to the other state on the second write condition, in which a second voltage an absolute value of which is smaller than an absolute value of the first voltage is applied between said first electrode and said second electrode, if the resistance value of said variable resistance layer is equal to or greater than the threshold value.

15. The nonvolatile memory device according to claim 13, wherein said control circuit:
changes the resistance state of said variable resistance layer from the one state to the other state on the first write condition in which a first voltage is applied between said first electrode and said second electrode for a first time if the resistance value of said variable resistance layer is smaller than the threshold value; and
changes the resistance state of said variable resistance layer from the one state to the other state by applying a second voltage between said first electrode and said second electrode for a second time shorter than the first time if the resistance value of said variable resistance layer is equal to or greater than the threshold value.

16. The nonvolatile memory device according to claim 13, wherein the one state is the high resistance state, and the other state is the low resistance state.

17. The nonvolatile memory device according to claim 13, wherein the one state is the low resistance state, and the other state is the high resistance state.

18. A method for programming a nonvolatile memory device, the nonvolatile memory device comprising:
a nonvolatile memory element including: a first electrode; a second electrode; and a variable resistance layer having a resistance state which reversibly changes between a high resistance state and a low resistance state in which a resistance value of said variable resistance layer is smaller than the resistance value in the high resistance state, based on electrical signals having different polarities which are given between said first electrode and said second electrode, said variable resistance layer being interposed between said first electrode and said second electrode,
said method for programming the nonvolatile memory element comprising:
applying between the first electrode and the second electrode a high resistance writing voltage which has a first polarity to change a resistance state of the variable resistance layer from the low resistance state to the high resistance state;
determining whether the resistance value of the variable resistance layer in the high resistance state is equal to or greater than a first threshold value;
applying between the first electrode and the second electrode a first voltage having a second polarity opposite to the first polarity if the resistance value of the variable resistance layer in the high resistance state is smaller than the first threshold value to change the resistance state of the variable resistance layer from the high resistance state to the low resistance state; and
applying between the first electrode and the second electrode a second voltage having a second polarity an absolute value of which is smaller than an absolute value of the first voltage if the resistance value of the variable resistance layer in the high resistance state is equal to or greater than the first threshold value to change the resistance state of the variable resistance layer from the high resistance state to the low resistance state.

19. A method for programming a nonvolatile memory device, the nonvolatile memory device comprising:
a nonvolatile memory element including: a first electrode; a second electrode; and a variable resistance layer having a resistance state which reversibly changes between a high resistance state and a low resistance state in which a resistance value of said variable resistance layer is smaller than the resistance value in the high resistance state, based on electrical signals having different polarities which are given between said first electrode and said second electrode, said variable resistance layer being interposed between said first electrode and said second electrode,
said method for programming the nonvolatile memory element comprising:
applying a voltage between the first electrode and the second electrode to change a resistance state of the variable resistance layer from one state between the low resistance state and the high resistance state to the other state, determining whether the resistance value of the variable resistance layer in the other state is equal to or greater than a first threshold value;

changing the resistance state of the variable resistance layer from the one state between the high resistance state and the low resistance state to the other state on a first write condition if the resistance value of the variable resistance layer is smaller than a first threshold value; and changing the resistance state of the variable resistance layer from the one state to the other state on a second write condition weaker than the first write condition if the resistance value of the variable resistance layer is equal to or greater than the first threshold value.

* * * * *